United States Patent
Mikano et al.

(10) Patent No.: US 12,366,592 B2
(45) Date of Patent: Jul. 22, 2025

(54) ELECTRIC CURRENT DETECTION APPARATUS

(71) Applicant: Kohshin Electric Corporation, Kasaoka (JP)

(72) Inventors: Akihiro Mikano, Kasaoka (JP); Shunsuke Watanabe, Kasaoka (JP); Nobuyuki Shinchi, Kasaoka (JP)

(73) Assignee: KOHSHIN ELECTRIC CORPORATION, Okayama (JP)

( * ) Notice: Subject to any disclaimer, the term of this patent is extended or adjusted under 35 U.S.C. 154(b) by 199 days.

(21) Appl. No.: 18/027,167

(22) PCT Filed: Sep. 21, 2021

(86) PCT No.: PCT/JP2021/034613
§ 371 (c)(1),
(2) Date: Mar. 20, 2023

(87) PCT Pub. No.: WO2022/065311
PCT Pub. Date: Mar. 31, 2022

(65) Prior Publication Data
US 2023/0333144 A1   Oct. 19, 2023

(30) Foreign Application Priority Data

Sep. 23, 2020   (JP) .................. 2020-159002

(51) Int. Cl.
*G01R 15/20*   (2006.01)
*G01R 19/00*   (2006.01)

(52) U.S. Cl.
CPC ......... *G01R 15/20* (2013.01); *G01R 19/0092* (2013.01)

(58) Field of Classification Search
CPC ... G01R 19/0092; G01R 15/207; G01R 15/20
See application file for complete search history.

(56) References Cited

U.S. PATENT DOCUMENTS

| 2010/0194381 A1 | 8/2010 | Ito et al. |
| 2015/0204915 A1* | 7/2015 | Okuyama ............ G01R 15/207 |
| | | 324/117 R |

(Continued)

FOREIGN PATENT DOCUMENTS

| JP | 2005195427 A * | 7/2005 | ............. G01R 15/02 |
| JP | 2005283451 A | 10/2005 | |

(Continued)

OTHER PUBLICATIONS

JP-2005195427-A, Nagano, Machine translation (Year: 2005).*

(Continued)

*Primary Examiner* — Eman A Alkafawi
*Assistant Examiner* — Suresh K Rajaputra
(74) *Attorney, Agent, or Firm* — MATTINGLY & MALUR, PC

(57) ABSTRACT

In some examples, an electric current detection device includes a conductor to which an electric current to be measured is applied, and a circuit unit that has at least a pair of magnetism detection elements for respectively detecting magnetic fluxes generated around the conductor by the electric current. The electric current may be detected based on detection signals obtained from the magnetism detection elements. The magnetism detection elements have a detection sensitivity relative to magnetic fluxes in a parallel orientation. Further, the magnetism detection elements are arranged at positions that are asymmetric positions that avoid a cross-section center of the conductor and that have mutually different distances from the cross-section center. Additionally, the magnetism detection elements are opposed to each other by sandwiching a line that passes through the cross-section center and which is perpendicular to a direction along which the magnetism detection elements are aligned.

9 Claims, 20 Drawing Sheets

(56) References Cited

U.S. PATENT DOCUMENTS

| | | | |
|---|---|---|---|
| 2019/0170793 A1* | 6/2019 | Okuyama | G01R 33/025 |
| 2020/0191835 A1* | 6/2020 | Bilbao De Mendizabal | G01R 33/0011 |
| 2020/0333380 A1 | 10/2020 | Vuillermet et al. | |

FOREIGN PATENT DOCUMENTS

| | | | | |
|---|---|---|---|---|
| JP | 2008216230 A | | 9/2008 | |
| JP | 2009020085 A | * | 1/2009 | G01R 15/02 |
| JP | 2010175474 A | | 8/2010 | |
| JP | 2013170878 A | | 9/2013 | |
| JP | 2014115114 A | | 6/2014 | |
| WO | 2015115238 A1 | | 8/2015 | |
| WO | WO-2015115472 A1 | * | 8/2015 | G01R 15/202 |
| WO | 2015133621 A1 | | 9/2015 | |

OTHER PUBLICATIONS

JP-2009020085-A, Shinchi Nobiyuki et al, Machine translation (Year: 2009).*
WO-2015115472-A1, Takaki et al, Machine translation (Year: 2015).*
International Search Report of PCT/JP2021/034613 dated Nov. 22, 2021.
International Preliminary Examination Report PCT/JP2021/034613 dated Dec. 28, 2022.

* cited by examiner

Magnetic Flux Density of Magnetism Detection Elements a, b, c, d, (a-b), and (c-d)

| | a | b | Differential (a-b) | c | d | Differential (c-d) |
|---|---|---|---|---|---|---|
| When direct current is applied (FIG. 1) | 0.6mT | -0.6mT | 1.2mT | 0.1mT | -0.68mT | 0.78mT |
| When 100-kHz alternating current is applied (FIG. 2) | 0.32mT | -0.33mT | 0.65mT | 0.02mT | -0.70mT | 0.72mT |

FIG. 3

| ○ Attenuation Rate with Reference to 60-Hz Magnetic Flux Density | | | | | (%) |
|---|---|---|---|---|---|
| Element Positions | Frequency (Hz) | | | | |
| | 60 | 1,000 | 10,000 | 100,000 | 1,000,000 |
| a,b(G=0mm) | 0.00 | -0.17 | -11.27 | -39.05 | -44.66 |
| c,d(G=1.0mm) | 0.00 | 0.00 | -0.38 | -5.15 | -6.68 |

ELECTRIC CURRENT DETECTION APPARATUS

TECHNICAL FIELD

The present invention relates to an electric current detection device which uses magnetism detection elements.

BACKGROUND ART

An electric current detection device which is used for, for example, an inverter in recent years has requirements described as follows. As a first requirement, its frequency characteristics should extend favorably to a high frequency area so that the electric current detection device becomes compatible with high-speed switching of the inverter, that is, it is required that the sensitivity will not diminish even in an area where the frequency of an electric current which is a detection target is high. However, with an electric current detection device which uses a normal magnetic core (hereinafter simply referred to as the "core") and magnetism detection elements, a magnetic flux density (sensitivity) diminishes in the high-frequency area due to an influence of iron loss of the core.

Moreover, regarding an electric current detection device which is used for a motor driving inverter or the like in recent years, bus bars in adjacent phases are sometimes located at positions very close to each other because of the reasons, for example, its common usage form is three phases and it thereby has a complicated wiring structure. In order to deal with this situation, it is required as a second requirement that the electric current detection device should be hardly influenced by an external magnetic field.

In order to implement the electric current detection device which satisfies the above-described requirements, there is known a technology described in PTL 1. An electric current measurement device disclosed in PTL 1 is designed so that, as two routes of electric current to be measured flow through two electric current conductors for the electric current to be measured, which is branched by a slit formed in one bus bar which is an object to measure the electric current, two types of magnetic fields passing through in the same direction are generated. The influence on the surroundings by the magnetic fields are canceled and the magnitude of the electric current is measured accurately by arranging two magnetism detection elements constituting a pair at specified positions to make them protrude through this slit and acquiring the difference between the detection signals obtained by the respective magnetism detection elements.

CITATION LIST

Patent Literature

PTL 1: Japanese Laid-Open Patent Application No. 2005-283451

SUMMARY OF THE INVENTION

Problems to be Solved by the Invention

However, the configuration described in PTL 1 is not sufficient to satisfy the aforementioned first requirement. Particularly, if the frequency of the measured electric current becomes high, the distribution of magnetic fluxes generated around the conductor due to the influence of an skin effect changes, which results in a problem of diminishing the sensitivity in the high-frequency area.

The present invention was devised to solve the above-described problem and it is an object of the invention to provide a coreless-type electric current detection device which suppresses the influence of the external magnetic field and obtains good frequency characteristics even in the high-frequency area.

Means to Solve the Problems

In order to solve the above-described problem, there is provided an electric current detection device according to the present invention including: a conductor to which an electric current to be measured is applied; and a circuit unit that has at least a pair of magnetism detection elements for respectively detecting magnetic fluxes generated around the conductor by the electric current to be measured and that detects the electric current to be measured on the basis of detection signals obtained from the pair of magnetism detection elements, wherein the pair of magnetism detection elements is arranged at asymmetric positions avoiding a cross-section center of the conductor and having mutually different distances from the cross-section center.

Advantageous Effects of the Invention

The present invention makes it possible to provide the coreless-type electric current detection device which suppresses the influence of the external magnetic field and obtains the good frequency characteristics even in the high-frequency area.

BRIEF DESCRIPTION OF DRAWINGS

FIG. 3 is a table indicating detection results of a magnetic flux density by magnetism detection elements in FIG. 1 and FIG. 2;

DESCRIPTION OF EMBODIMENTS

Embodiments of the present invention will be explained below with reference to the drawings. Regarding FIG. 1 to FIG. 3, electric current detection principles of the present invention will be explained. Regarding FIG. 4A to FIG. 9B, the relation between the arrangement of magnetism detection elements and frequency characteristics of a detected magnetic flux density will be explained. Regarding FIG. 10 to FIG. 14B, embodiments of an electric current detection device to which the present invention is applied will be explained.

(Electric Current Detection Principles)

Figure 1:
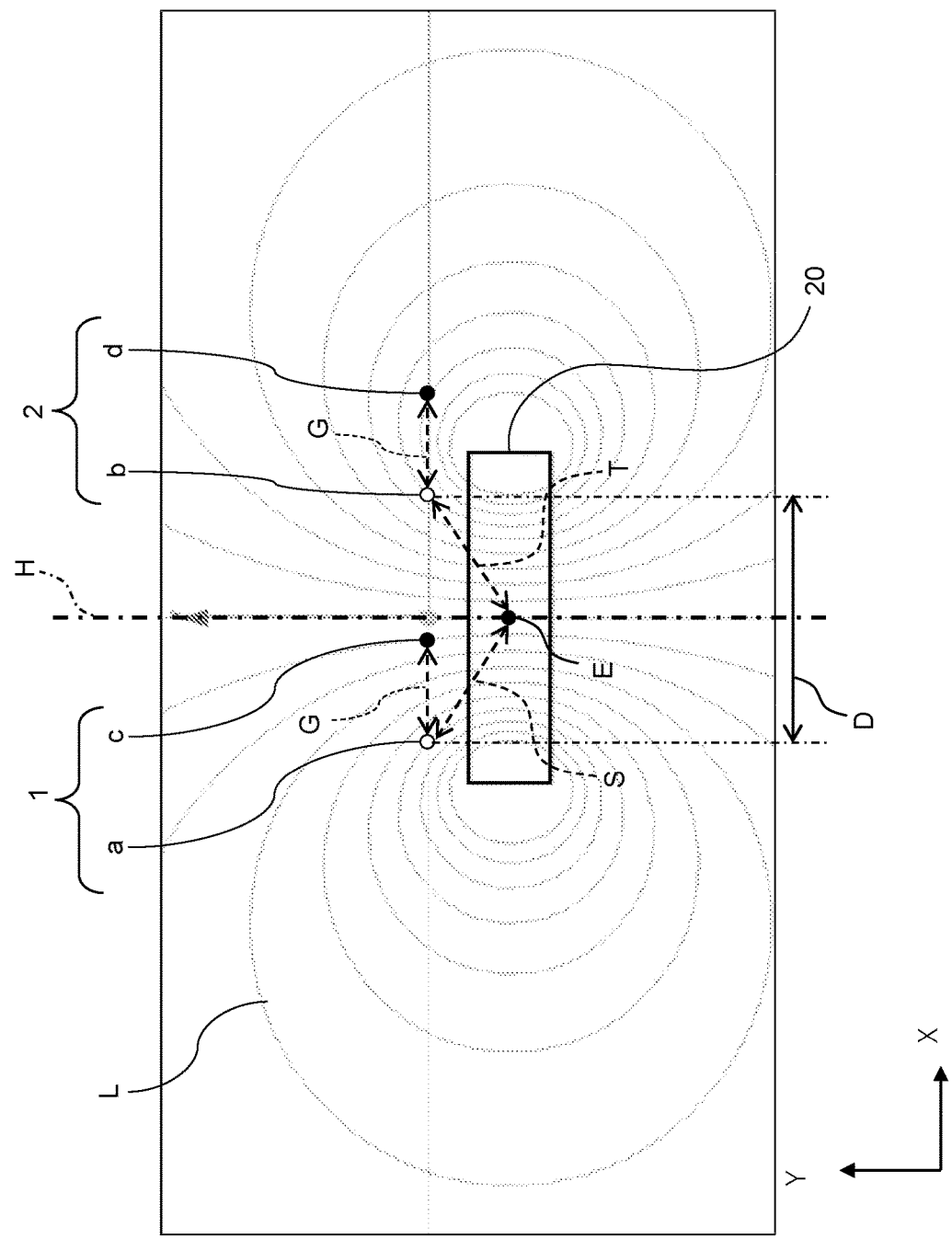
FIG. 1 is a figure of magnetic lines of forces for explaining the principles of an electric current detection device according to an embodiment of the present invention.
Figure 2:
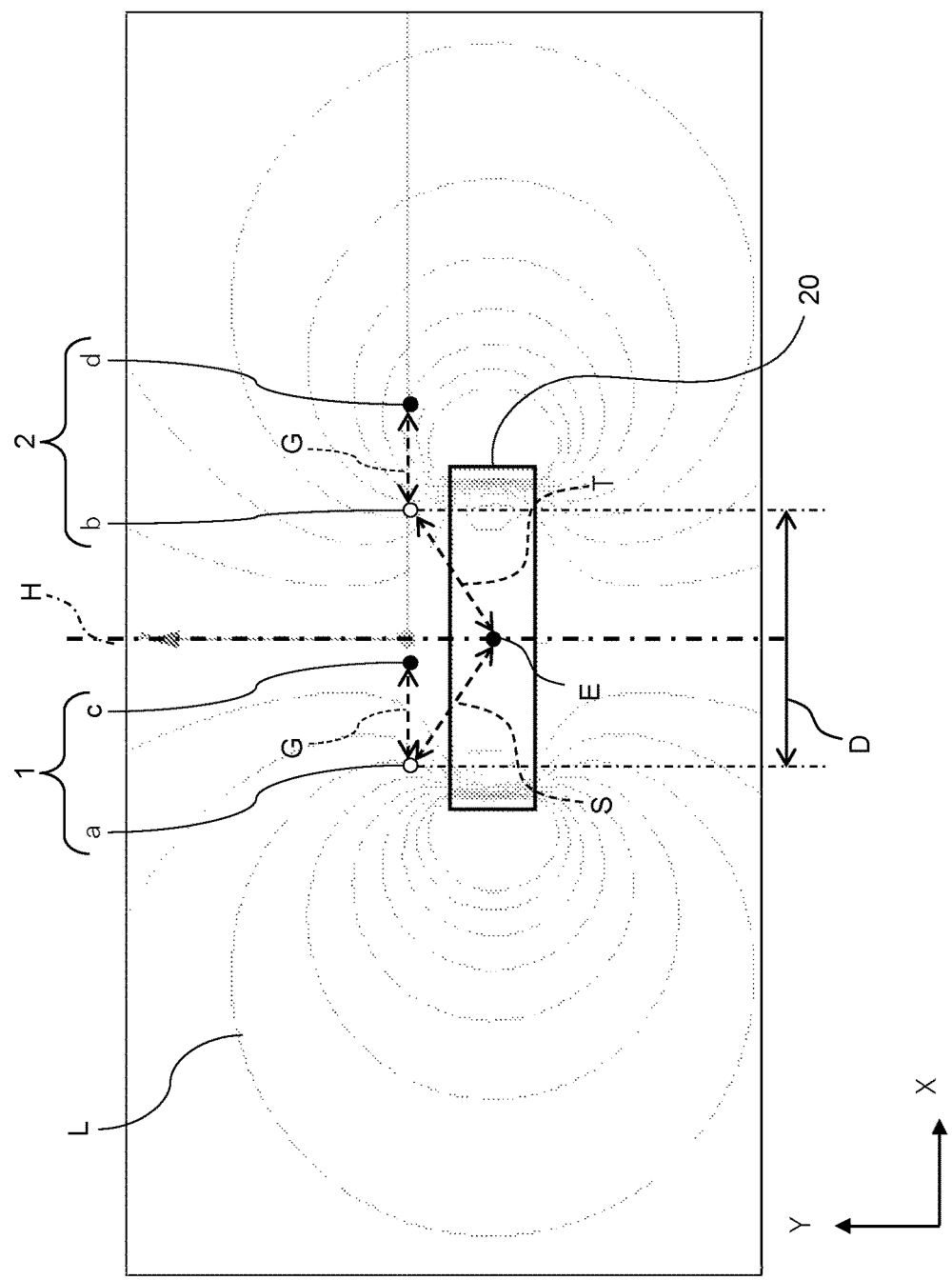
FIG. 2 is a figure of magnetic lines of forces for explaining the principles of the electric current detection device according to the embodiment of the present invention.

FIG. 1 and FIG. 2 are figures of magnetic lines of forces for explaining the electric current detection principles of an electric current detection device according to an embodiment of the present invention. FIG. 1 and FIG. 2 illustrate examples of the magnetic flux density regarding which only magnetic fluxes in a Y-direction in a cross-sectional direction of a conductor 20 are extracted when a direct current and a 100-kHz alternating current are applied respectively as electric currents to be measured to the long-plate-shaped conductor 20, on which magnetism detection elements 1, 2 which constitute a pair are arranged, by using a plurality of magnetic force lines L. Under this circumstance, each of FIG. 1 and FIG. 2 illustrates a cross section of the long-plate-shaped conductor 20, which extends in an extending direction perpendicular to the paper, as taken along a plane including the magnetism detection elements 1, 2. In these sectional views, the conductor 20 has a cross-sectional shape which is longer in its width direction than its plate thickness direction. Moreover, the width direction of the conductor 20, that is, a horizontal direction of the paper is defined as an X-axis and the plate thickness direction of the conductor 20, that is, a vertical direction of the paper is defined as a Y-axis.

In FIG. 1 and FIG. 2, the magnetism detection elements 1, 2 are arranged at either a combination of positions respectively indicated by the letter a and the letter b or a combination of positions respectively indicated by the letter c and the letter d. In the following description, regarding the magnetism detection element 1 at the position a, the magnetism detection element 2 at the position b, the magnetism detection element 1 at the position c, and the magnetism detection element 2 at the position d, the respective elements and their arrangements will be explained by referring to them for short as the magnetism detection element a to the magnetism detection element d, respectively.

The magnetism detection elements a, b are arranged at symmetric positions with an equal distance from a center line H in the width direction (the X-axis direction) of the conductor 20. Under this circumstance, the distances S, T from a cross-section center E of the conductor 20 to the magnetism detection elements a, b are equal to each other. On the other hand, the magnetism detection elements c, d are arranged at positions displaced from the magnetism detection elements a, b by a deviation distance G in the X-axis direction, that is, at asymmetric positions with mutually different distances from the center line H. Moreover, the magnetism detection elements a to d are arranged respectively in orientations to have detection sensitivity relative to magnetic fluxes in the Y-axis direction. Accordingly, the combination of the magnetism detection elements a, b and the combination of the magnetism detection elements c, d are designed to detect the magnetic fluxes in the plus Y-direction and the minus Y-direction which are mutually opposite directions, among the magnetic fluxes generated around the conductor 20 by the electric current flowing through the conductor 20.

FIG. 3 is a table indicating detection results of the magnetic flux density by the magnetism detection elements 1, 2 in FIG. 1 and FIG. 2. The table in FIG. 3 shows: detected values of the magnetic flux density detected respectively by the magnetism detection elements a to d in the cases of FIG. 1 and FIG. 2, a differential calculation value of the magnetism detection elements 1, 2 as calculated from their detected values, that is, a difference value of the detection results of the combination of the magnetism detection element a and the magnetism detection element b and a difference value of the detection results of the combination of the magnetism detection element c and the magnetism detection element d.

The magnetic force lines L in FIG. 2 are concentrated at the ends of the conductor 20 as compared to FIG. 1 due to the growth of a skin effect caused in response to the higher frequency of the electric current which flows through the conductor 20. Therefore, in the table in FIG. 3, regarding the magnetism detection elements a, b, c which are arranged closer to the center of the conductor 20 than the ends of the conductor 20, the detected values of the magnetic flux density become lower in the case of FIG. 2 than in the case of FIG. 1. On the other hand, regarding the magnetism detection element d located outside the end of the conductor 20, the detected value of the magnetic flux density is higher in the case of FIG. 2 than in the case of FIG. 1. Furthermore, the magnetic flux density when the electric current is applied to the conductor 20 is symmetric relative to the center line H of the conductor 20 in both FIG. 1 and FIG. 2.

Specifically speaking, when the pair of magnetism detection elements 1, 2 is arranged at the symmetric positions a, b with the equal direction to the center line H in the width direction of the conductor 20 and if the frequency of the electric current flowing through the conductor 20 becomes high, the growth of the skin effect in response thereto causes both the magnetic fluxes which pass through the magnetism detection elements 1, 2 to decrease. Accordingly, this results in problems of a decrease in the differential calculation value obtained from the magnetism detection elements 1, 2 and degradation of the electric current measurement accuracy.

On the other hand, when the pair of magnetism detection elements 1, 2 is arranged at the asymmetric positions c, d with unequal distances from the center line H in the width direction of the conductor 20 and if the frequency of the electric current flowing through the conductor 20 becomes high, the growth of the skin effect in response thereto causes the magnetic flux which passes through the magnetism detection elements 1 to decrease and causes the magnetic flux which passes through the magnetism detection element 2 to increase. Accordingly, the differential calculation value obtained from the magnetism detection elements 1, 2 does not decrease and it is thereby possible to prevent the degradation of the electric current measurement accuracy.

When measuring the electric current by means of the differential calculation by using the pair of magnetism detection elements as explained above, it is possible to realize the good frequency characteristics even in the high-frequency area and prevent the degradation of the measurement accuracy in the high-frequency area by applying the magnetism detection elements c, d in the asymmetric arrangement.

Incidentally, FIG. 1 and FIG. 2 have been described about the case where the pair of magnetism detection elements 1, 2 is arranged at the symmetric positions (the positions a, b) or the asymmetric positions (the positions c, d) in the width direction of the conductor 20 with reference to the center line H in the width direction of the conductor 20; however, the reference for the positional relationship between these positions is not limited to the center line H. For example, even when the pair of magnetism detection elements 1, 2 is arranged at symmetric or asymmetric positions in the plate thickness direction of the conductor 20 with reference to the center line in the plate thickness direction of the conductor 20, it is possible to obtain the good frequency characteristics in the electric current measurement results in the case of the asymmetric arrangement in the same manner as explained about the table in FIG. 3. Alternatively, the advantageous effect similar to that described above can be obtained even by arranging the pair of magnetism detection elements 1, 2 at asymmetric positions in a direction which is neither the width direction nor the plate thickness direction of the conductor 20. In other words, in any of the above cases, the pair of magnetism detection elements 1, 2 can be arranged asymmetrically by setting the distances S, T from the cross-section center E of the conductor 20 as unequal distances. Under this circumstance, the cross-section center of the conductor 20 has a low magnetic flux density and cannot be expected to have an increase in the detection sensitivity by means of the differential calculation. So, it is desirable that the magnetism detection elements 1, 2 be arranged to avoid the cross-section center of the conductor 20. Furthermore, if both the magnetism detection elements 1, 2 are arranged in either the right side or the left side with reference to the center line H, detection signals obtained respectively by the magnetism detection elements 1, 2 become the detection signals of the magnetic fluxes in the same direction and, therefore, an increase in the detection sensitivity cannot be expected. So, it is desirable that the magnetism detection elements 1, 2 be arranged separately on the right and left sides with reference to the center line H. In order to satisfy these conditions, the deviation distance G of the asymmetric positions c, d from the symmetric positions a, b should preferably be decided to avoid the arrangement where the magnetism detection elements 1, 2 respectively detect the magnetic fluxes in the same direction, and the arrangement where either one of the magnetism detection elements 1, 2 does not detect the magnetic flux. As a result, it is possible to obtain the good frequency characteristics for the electric current measurement using the magnetism detection elements 1, 2 even in the high-frequency area and prevent the degradation of the measurement accuracy in the high-frequency area.

(Relation between Arrangement of Magnetism Detection Elements and Frequency Characteristics of Detected Magnetic Flux Density)

Next, the relation between the arrangement of the magnetism detection elements and the frequency characteristics of the magnetic flux density detected by them will be explained by using FIG. 4A to FIG. 9B.

Figure 4A:
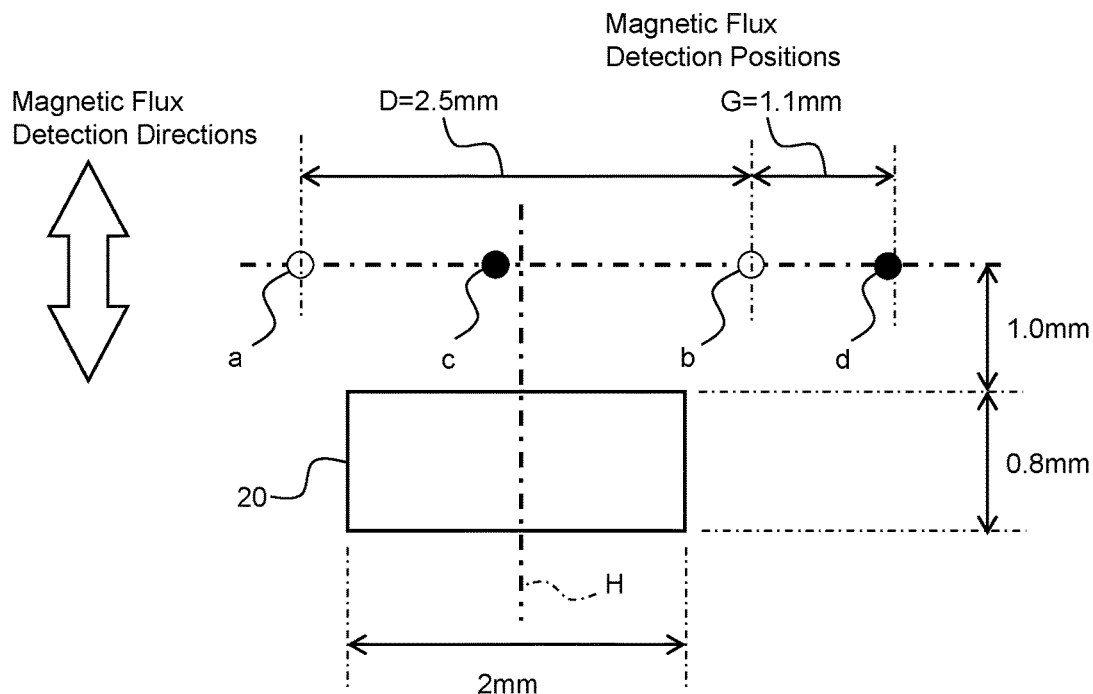
FIG. 4A is a sectional view illustrating an arrangement example of the magnetism detection elements relative to a long-plate-shaped conductor.

FIG. 4A is a sectional view illustrating an arrangement example of the magnetism detection elements 1, 2 relative to a long-plate-shaped conductor 20. In FIG. 4A, the conductor 20 is a rectangle whose cross section is 2 mm×0.8 mm, and two magnetism detection elements 1, 2 which constitute a pair and has the same performance are arranged close to the conductor 20. The arrangement of these magnetism detection elements 1, 2 is a combination of the position a and the position b or a combination of the position c and the position d as illustrated in FIG. 4A and this is similar to the positions a, b, c, d illustrated in FIG. 1 and FIG. 2. Specifically speaking, the magnetism detection elements 1, 2 are arranged at either the combination of the symmetric positions a, b relative to the width direction of the conductor 20 or the combination of the asymmetric positions c, d relative to the width direction of the conductor 20. Furthermore, a straight line coupling the pair of magnetism detection elements 1, 2 together is parallel to the width direction of the conductor 20.

Under this circumstance, the dimensions of each part in the arrangement in FIG. 4A are defined as follows. The distance between the pair of magnetism detection elements 1, 2 is D=2.5 mm. Moreover, the positions c, d are displaced from the positions a, b by the deviation distance G=1.1 mm in the width direction of the conductor 20. This deviation distance G may be decided to satisfy the aforementioned conditions. Also, the straight line coupling the positions a to d together is separated from the conductor 20 by 1.0 mm.

Figure 4B:
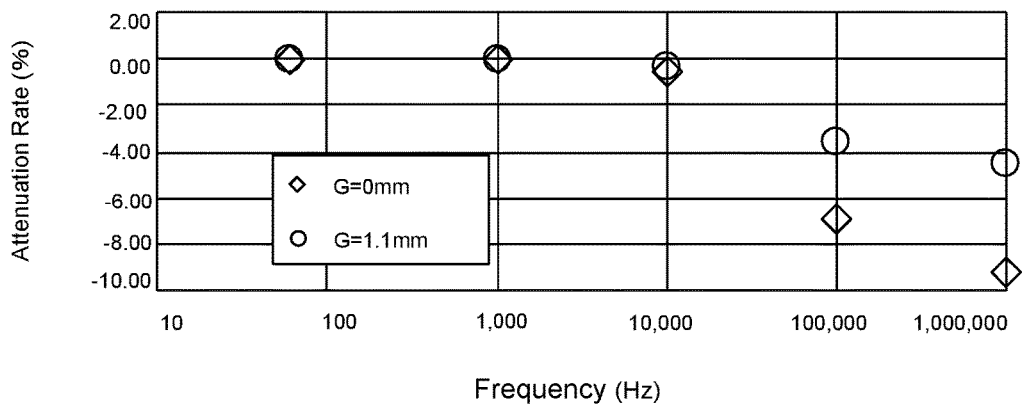
FIG. 4B is a table and graph indicating frequency characteristics of an attenuation rate of the magnetic flux density detected by the magnetism detection elements in the arrangement example in FIG. 4A.

FIG. 4B is a table and graph illustrating frequency characteristics of the attenuation rate of the magnetic flux density detected by the magnetism detection elements 1, 2 in the arrangement example of FIG. 4A. Referring to FIG. 4B, you can see that the attenuation rate of the magnetic flux density detected in the high-frequency area of 100 kHz or higher is lower and flat frequency characteristics can be maintained in the case where the pair of magnetism detection elements 1, 2 is arranged at the asymmetric positions c, d with the deviation of the deviation distance G=1.1 mm rather than the case of the symmetric positions a, b.

Figure 5A:
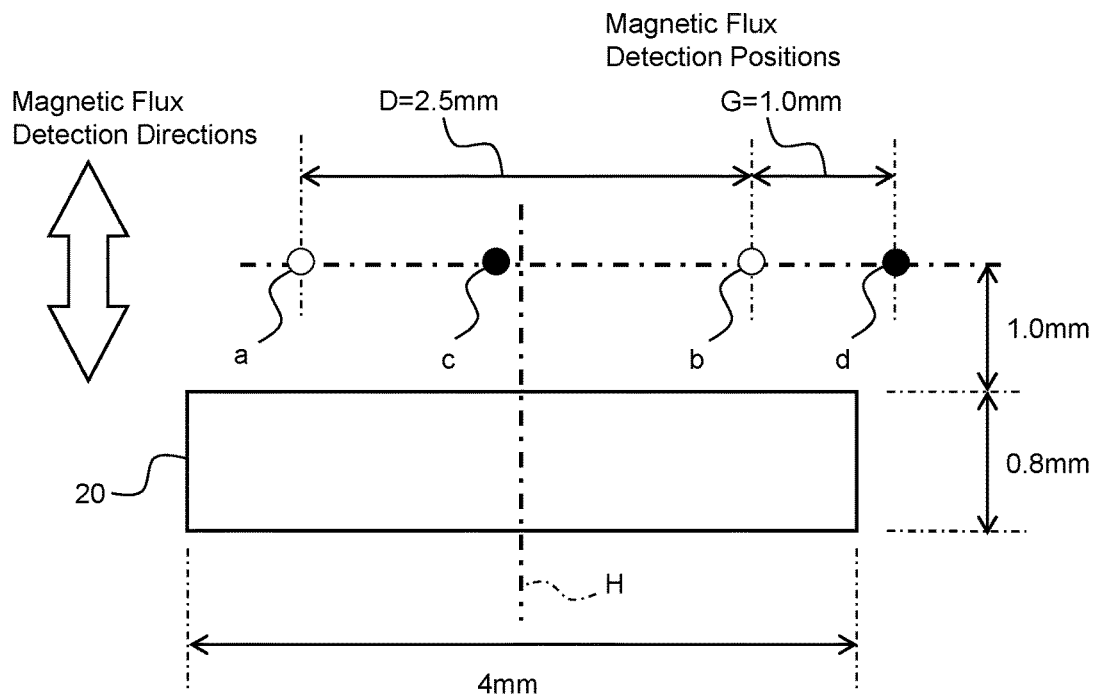
FIG. 5A is a sectional view illustrating an arrangement example of the magnetism detection elements relative to a long-plate-shaped conductor which has a different shape from that of FIG. 4A.

FIG. 5A is a sectional view illustrating an arrangement example of the magnetism detection elements 1, 2 relative to the long-plate-shaped conductor 20 of a different shape from that of FIG. 4A. In FIG. 5A, the conductor 20 is a rectangle whose cross section is 4 mm×0.8 mm, and two magnetism detection elements 1, 2 which constitute a pair and has the same performance are arranged close to the conductor 20. The arrangement of these magnetism detection elements 1, 2 is a combination of the position a and the position b or a combination of the position c and the position d as illustrated in FIG. 5A and this is similar to the positions a, b, c, d illustrated in FIG. 1 and FIG. 2. Specifically speaking, the magnetism detection elements 1, 2 are arranged at either the combination of the symmetric positions a, b relative to the width direction of the conductor 20 or the combination of the asymmetric positions c, d relative to the width direction of the conductor 20. Furthermore, the straight line coupling the pair of magnetism detection elements 1, 2 together is parallel to the width direction of the conductor 20.

Under this circumstance, the dimensions of each part in the arrangement in FIG. 5A are defined as follows. The distance between the pair of magnetism detection elements 1, 2 is D=2.5 mm. Moreover, the positions c, d are displaced from the positions a, b by the deviation distance G=1.0 mm in the width direction of the conductor 20. Also, the straight line coupling the positions a to d together is separated from the conductor 20 by 1.0 mm.

Figure 5B:
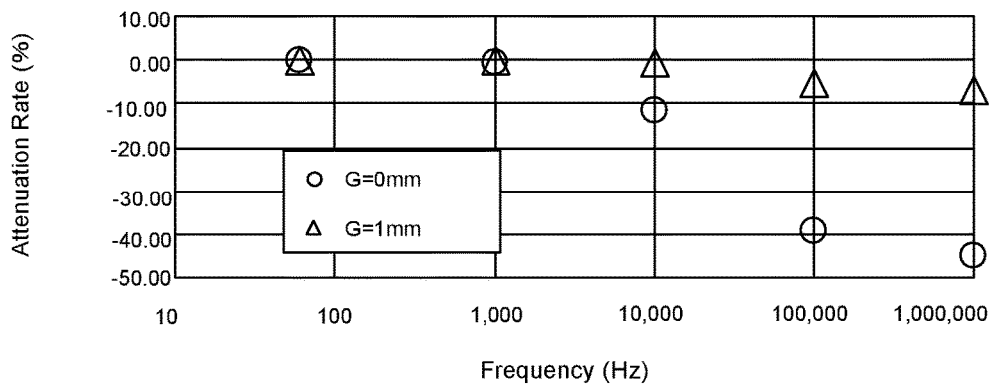
FIG. 5B is a table and graph indicating the frequency characteristics of the attenuation rate of the magnetic flux density detected by the magnetism detection elements in the arrangement example in FIG. 5A.

FIG. 5B is a table and graph illustrating frequency characteristics of the attenuation rate of the magnetic flux density detected by the magnetism detection elements 1, 2 in the arrangement example of FIG. 5A. Referring to FIG. 5B, you can see that the attenuation rate of the magnetic flux density detected in the high-frequency area of 100 kHz to 1 MHz is lower and the flat frequency characteristics can be maintained in the case where the pair of magnetism detection elements 1, 2 is arranged at the asymmetric positions c, d with the deviation of the deviation distance G=1.0 mm rather than the case of the symmetric positions a, b.

Figure 6A:
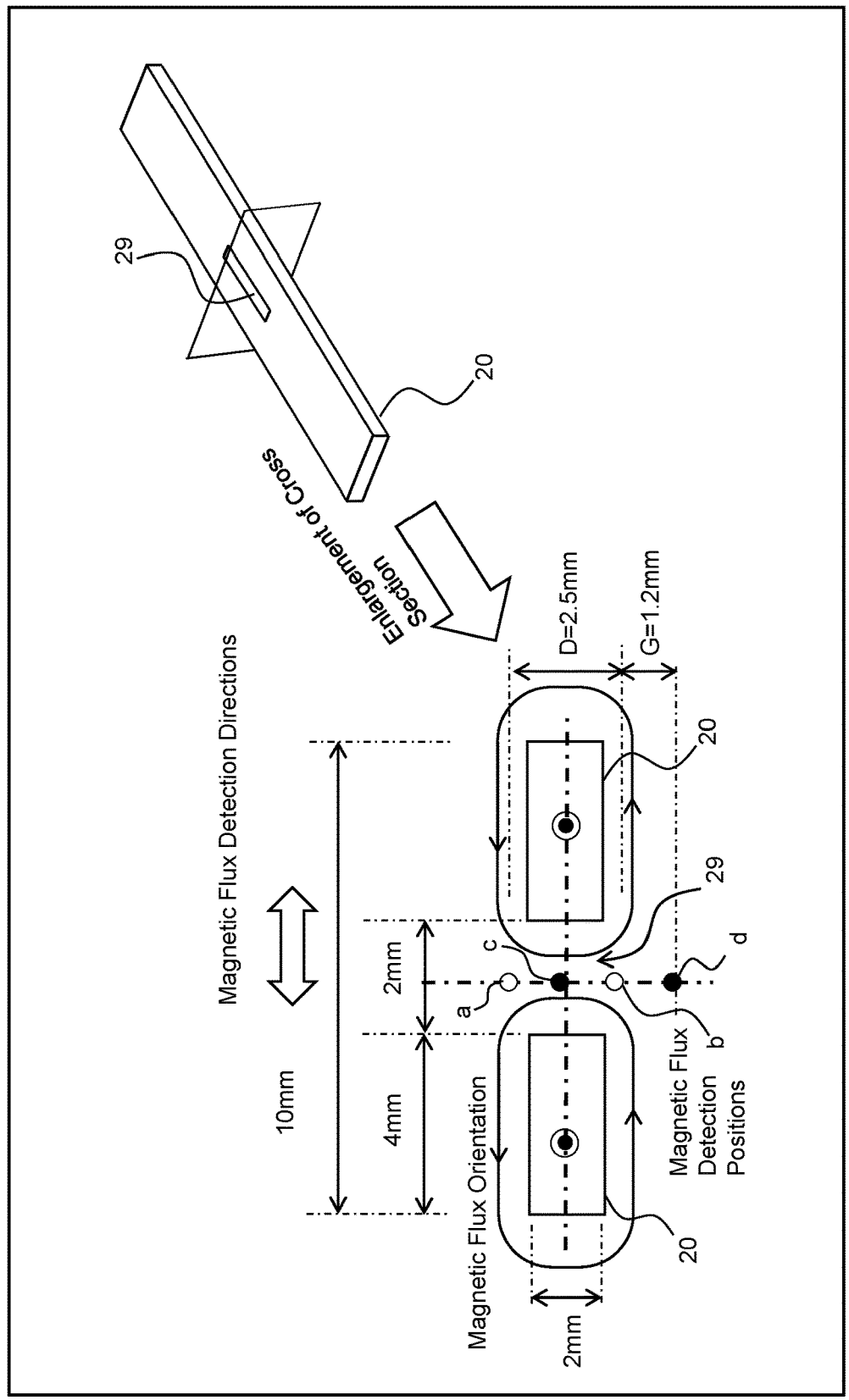
FIG. 6A shows a perspective view and enlarged sectional view illustrating an arrangement example of the magnetism detection elements relative to a long-plate-shaped conductor in which a slit is provided.

FIG. 6A is a perspective view and enlarged sectional view illustrating an arrangement example of the magnetism detection elements 1, 2 relative to the long-plate-shaped conductor 20 in which a slit 29 is provided. Referring to FIG. 6A, the conductor 20 is a rectangular whose cross section is 10 mm×2 mm, and the slit 29 which passes through the conductor 20 in its plate thickness direction is formed through its center part. The size of the slit 29 is appropriately 2 mm wide and 10 mm long.

At the part where the slit 29 in the conductor 20 is provided, two current paths in the same direction exist side by side as the electric current flowing through the conductor 20 is divided into two currents by the slit 29. The two magnetism detection elements 1, 2 which constitute a pair and has the same performance are arranged by aligning them in a direction to pass through the slit 29 in a cross section which is perpendicular to the two current paths. The arrangement of these magnetism detection elements 1, 2 is a combination of the position a and the position b or a combination of the position c and the position d as illustrated in FIG. 6A.

Incidentally, the positions a, b, c, d illustrated in FIG. 6A correspond to the positions a, b, c, d when the magnetism detection elements 1, 2 are arranged by aligning them in the plate thickness direction of the conductor 20 in FIG. 1 and FIG. 2. Specifically speaking, the magnetism detection elements 1, 2 are arranged at either the combination of the symmetric positions a, b relative to the plate thickness direction of the conductor 20 or the combination of the asymmetric positions c, d relative to the plate thickness direction of the conductor 20. Furthermore, a straight line coupling the pair of magnetism detection elements 1, 2 together is parallel to the plate thickness direction of the conductor 20.

Under this circumstance, the dimensions of each part in the arrangement in FIG. 6A are defined as follows. The distance between the pair of magnetism detection elements 1, 2 is D=2.5 mm. Moreover, the positions c, d are displaced from the positions a, b by the deviation distance G=1.2 mm in the plate thickness direction of the conductor 20. This deviation distance G may be decided to satisfy the aforementioned conditions in the same manner as in the cases of FIG. 4A and FIG. 5A.

Figure 6B:
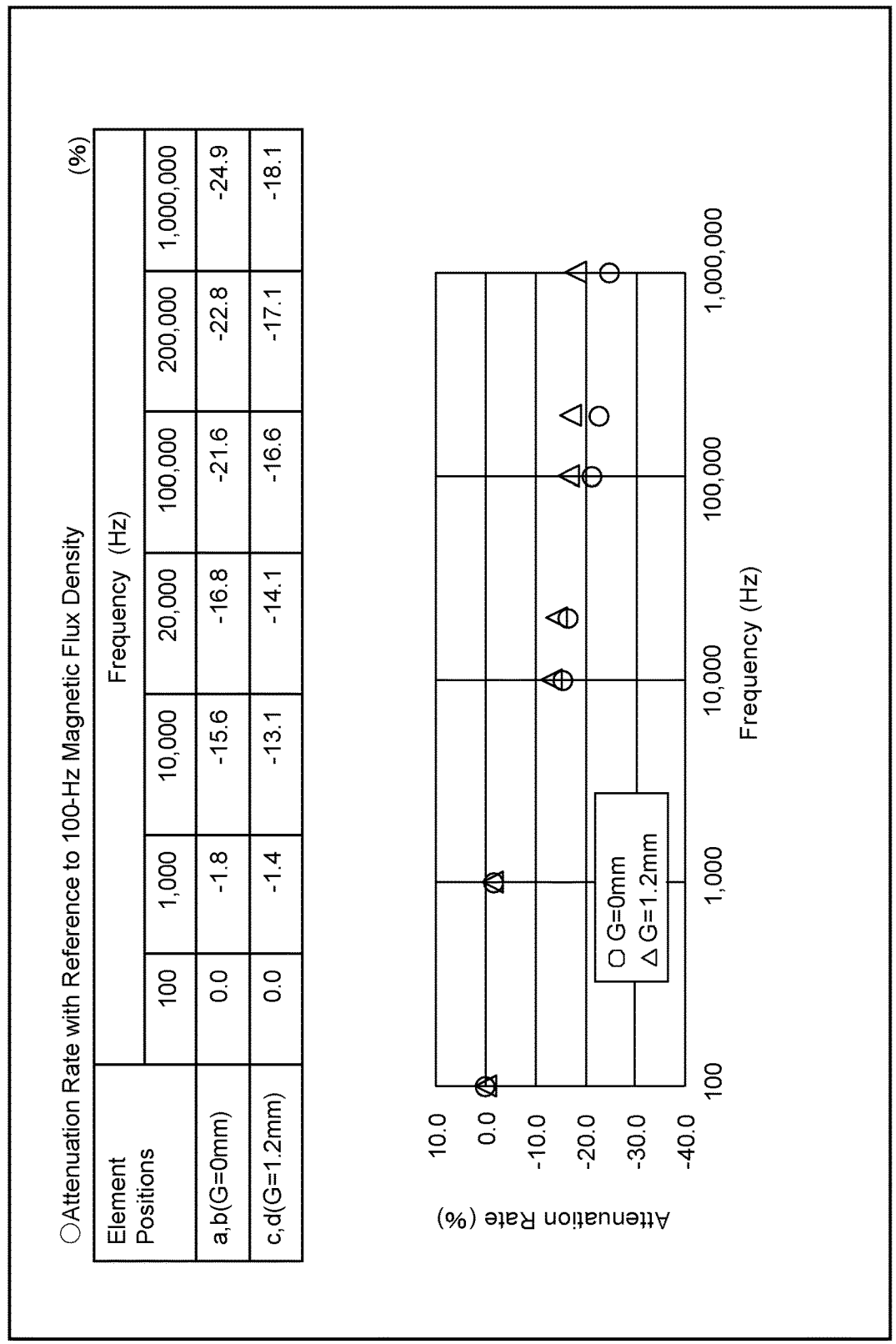
FIG. 6B is a table and graph indicating the frequency characteristics of the attenuation rate of the magnetic flux density detected by the magnetism detection elements in the arrangement example in FIG. 6A.

FIG. 6B is a table and graph illustrating frequency characteristics of the attenuation rate of the magnetic flux density detected by the magnetism detection elements 1, 2 in the arrangement example of FIG. 6A. Referring to FIG. 6B, you can see that the attenuation rate of the magnetic flux density detected in the high-frequency area of 100 kHz to 1 MHz is slightly lower and relatively good frequency characteristics can be maintained in the case where the pair of magnetism detection elements 1, 2 is arranged at the asymmetric positions c, d with the deviation of the deviation distance G=1.2 mm rather than the case of the symmetric positions a, b.

Figure 7A:
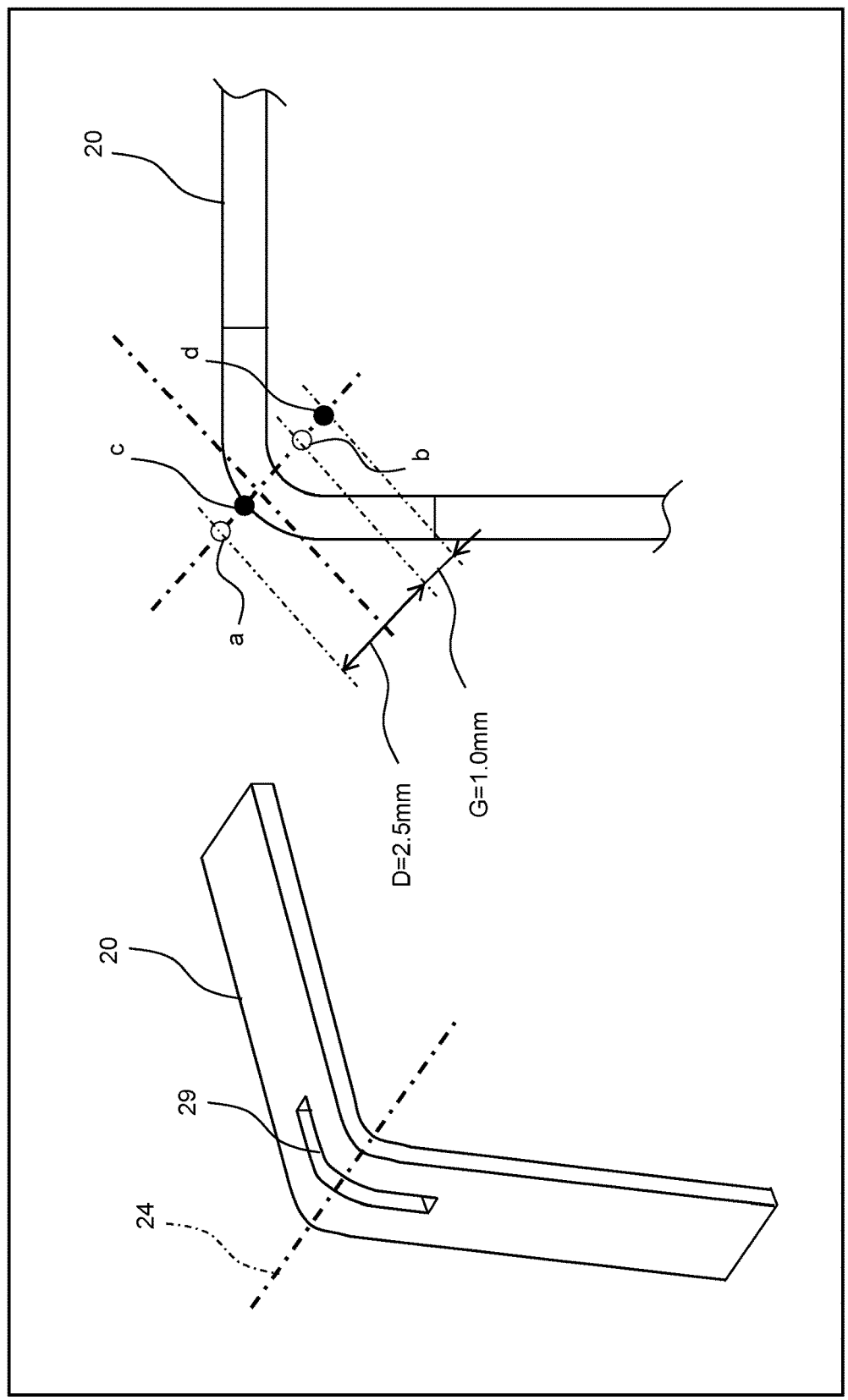
FIG. 7A is a perspective view and enlarged sectional view illustrating an arrangement example of the magnetism detection elements relative to a long-plate-shaped conductor in which a slit is provided and is bent.

FIG. 7A is a perspective view and enlarged sectional view illustrating an arrangement example of the magnetism detection elements 1, 2 relative to the long-plate-shaped conductor 20 in which the slit 29 is provided and which is bent. In FIG. 7A, the conductor 20 has a bent part which is bent in the plate thickness direction along a bending line 24 and the slit 29 similar to that in FIG. 6A is formed through the bent part.

At the bent part of the conductor 20, two current paths in the same direction exist side by side as the electric current flowing through the conductor 20 is divided into two currents by the slit 29. The two magnetism detection elements 1, 2 which constitute a pair and has the same performance are arranged by aligning them in a direction to pass through the slit 29 in a cross section which is perpendicular to the two current paths and along the direction to divide a bending angle of the bent part into two parts. The arrangement of these magnetism detection elements 1, 2 is a combination of the position a and the position b or a combination of the position c and the position d as illustrated in FIG. 7A.

Incidentally, the positions a, b, c, d illustrated in FIG. 7A, in the same manner as in FIG. 6A, correspond to the positions a, b, c, d when the magnetism detection elements 1, 2 are arranged by aligning them in the plate thickness direction of the above-described cross section in FIG. 1 and FIG. 2. Specifically speaking, the magnetism detection elements 1, 2 are arranged at either the combination of the symmetric positions a, b relative to the plate thickness direction of the conductor 20 or the combination of the asymmetric positions c, d relative to the plate thickness direction of the conductor 20. Furthermore, a straight line coupling the pair of magnetism detection elements 1, 2 together is parallel to the plate thickness direction of the conductor 20.

Under this circumstance, the dimensions of each part in the arrangement in FIG. 7A are defined as follows. The distance between the pair of magnetism detection elements 1, 2 is D=2.5 mm. Moreover, the positions c, d are displaced from the positions a, b by the deviation distance G=1.0 mm in the plate thickness direction of the conductor 20.

Figure 7B:
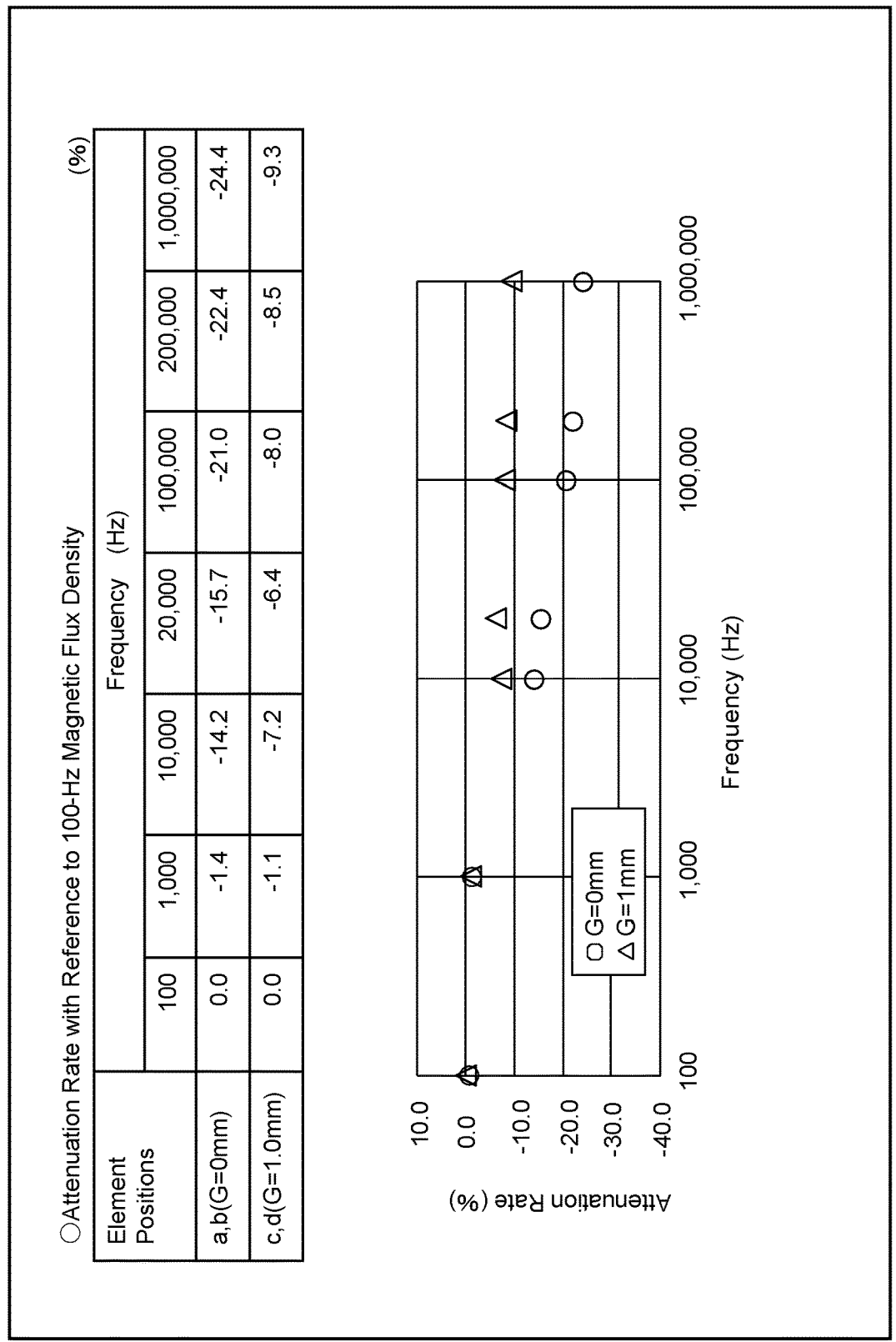
FIG. 7B is a table and graph indicating the frequency characteristics of the attenuation rate of the magnetic flux density detected by the magnetism detection elements in the arrangement example in FIG. 7A.

FIG. 7B is a table and graph illustrating frequency characteristics of the attenuation rate of the magnetic flux density detected by the magnetism detection elements 1, 2 in the arrangement example of FIG. 7A. Referring to FIG. 7B, you can see that the attenuation rate of the magnetic flux density detected in the high-frequency area of 100 kHz to 1 MHz is lower and the frequency characteristics which are substantially close to flat can be maintained in the case where the pair of magnetism detection elements 1, 2 is arranged at the asymmetric positions c, d with the deviation of the deviation distance G=1.0 mm rather than the case of the symmetric positions a, b.

Figure 8A:
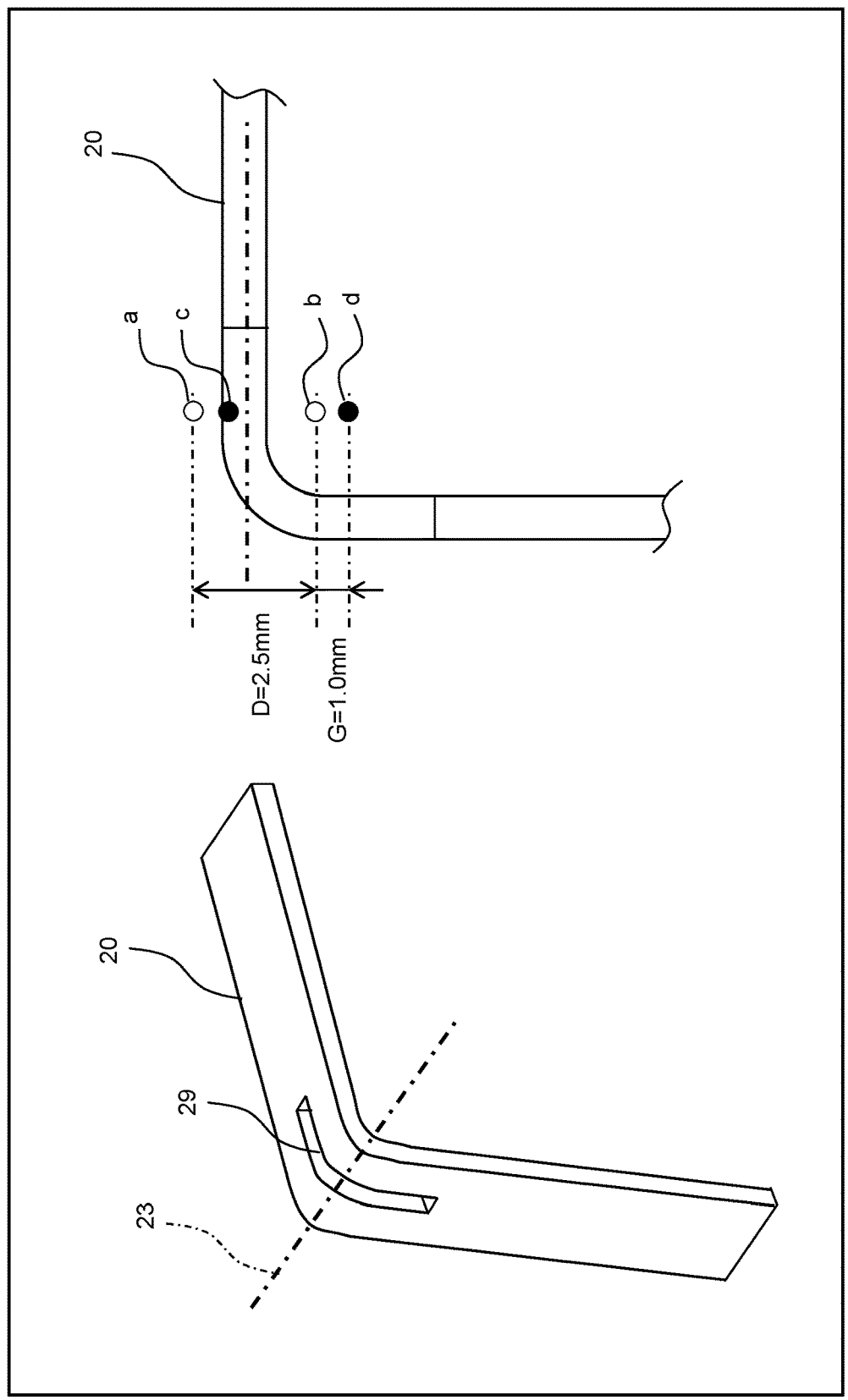
FIG. 8A is a perspective view and sectional view illustrating another arrangement example of the magnetism detection elements relative to the long-plate-shaped conductor in which a slit is provided and is bent.

FIG. 8A is a perspective view and sectional view illustrating another arrangement example of the magnetism detection elements 1, 2 relative to the long-plate-shaped conductor 20 in which the slit 29 is provided and which is bent. FIG. 8A illustrates the arrangement example in which the positional relationship between the conductor 20 and the magnetism detection elements 1, 2 is changed from that of the arrangement example explained with reference to FIG. 7A.

In FIG. 8A, the two magnetism detection elements 1, 2 which constitute a pair and has the same performance are arranged by aligning them in a direction to pass through the slit 29 in a cross section which is perpendicular to the two current paths and at positions displaced from the bent part. The arrangement of these magnetism detection elements 1, 2 is a combination of the position a and the position b or a combination of the position c and the position d as illustrated in FIG. 8A.

Incidentally, the positions a, b, c, d illustrated in FIG. 8A, in the same manner as in FIG. 6A and FIG. 7A, correspond to the positions a, b, c, d when the magnetism detection elements 1, 2 are arranged by aligning them in the plate thickness direction of the above-described cross section in FIG. 1 and FIG. 2. Specifically speaking, the magnetism detection elements 1, 2 are arranged at either the combination of the symmetric positions a, b relative to the plate thickness direction of the conductor 20 or the combination of the asymmetric positions c, d relative to the plate thickness direction of the conductor 20. Furthermore, a straight line coupling the pair of magnetism detection elements 1, 2 together is parallel to the plate thickness direction of the conductor 20.

Under this circumstance, the dimensions of each part in the arrangement in FIG. 8A are defined as follows. The distance between the pair of magnetism detection elements 1, 2 is D=2.5 mm. Moreover, the positions c, d are displaced from the positions a, b by the deviation distance G=1.0 mm in the plate thickness direction of the conductor 20.

Figure 8B:
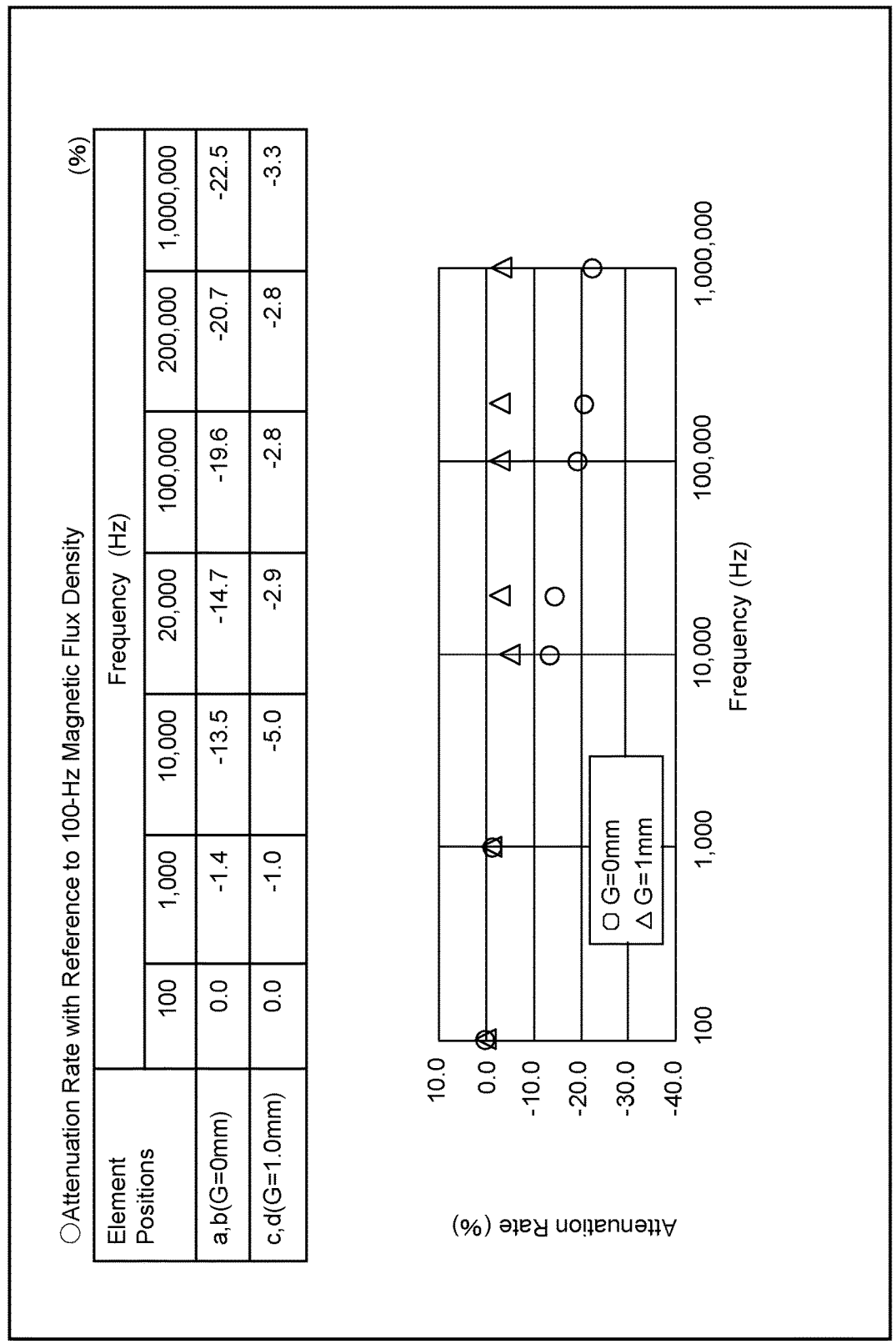
FIG. 8B is a table and graph indicating the frequency characteristics of the attenuation rate of the magnetic flux density detected by the magnetism detection elements in the arrangement example in FIG. 8A.

FIG. 8B is a table and graph illustrating frequency characteristics of the attenuation rate of the magnetic flux density detected by the magnetism detection elements 1, 2 in the arrangement example of FIG. 8A. Referring to FIG. 8B, you can see that the attenuation rate of the magnetic flux density detected in the high-frequency area of 10 kHz to 1 MHz is lower and the frequency characteristics which are close to flat can be maintained in the case where the pair of magnetism detection elements 1, 2 is arranged at the asymmetric positions c, d with the deviation of the deviation distance G=1.0 mm rather than the case of the symmetric positions a, b.

Figure 9A:
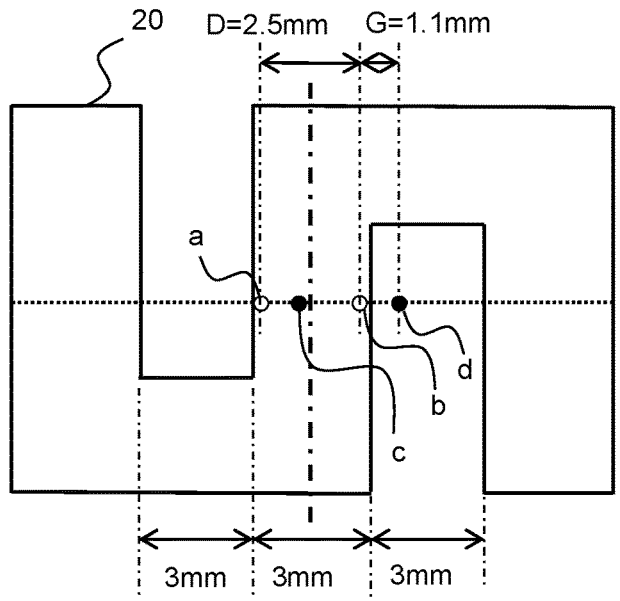
FIG. 9A is a front view illustrating an arrangement example of the magnetism detection elements relative to a long-plate-shaped conductor provided with crank parts.

FIG. 9A is a front view illustrating an arrangement example of the magnetism detection elements 1, 2 relative to the long-plate-shaped conductor 20 provided with crank parts. In FIG. 9A, the conductor 20 has the crank parts obtained by bending the conductor 20 in the width direction a plurality of number of times. The width of the conductor 20 and the distance between the crank parts of the conductor 20 are 3 mm, respectively. The two magnetism detection elements 1, 2 which constitute a pair and has the same performance are arranged by aligning them in the width direction of the conductor 20 at positions close to the conductor 20 at this crank part. The arrangement of these magnetism detection elements 1, 2 is the combination of the position a and the position b or the combination of the position c and the position d as illustrated in FIG. 9A.

Incidentally, the positions a, b, c, d illustrated in FIG. 9A, in the same manner as in FIG. 4A and FIG. 5A, correspond to the positions a, b, c, d as illustrated in FIG. 1 and FIG. 2. Specifically speaking, the magnetism detection elements 1, 2 are arranged at either the combination of the symmetric positions a, b relative to the plate thickness direction of the conductor 20 or the combination of the asymmetric positions c, d relative to the plate thickness direction of the conductor 20. Furthermore, a straight line coupling the pair of magnetism detection elements 1, 2 together is parallel to the plate thickness direction of the conductor 20.

Under this circumstance, the dimensions of each part in the arrangement in FIG. 9A are defined as follows. The distance between the pair of magnetism detection elements 1, 2 is D=2.5 mm. Moreover, the positions c, d are displaced from the positions a, b by the deviation distance G=1.1 mm in the width direction of the conductor 20.

Figure 9B:
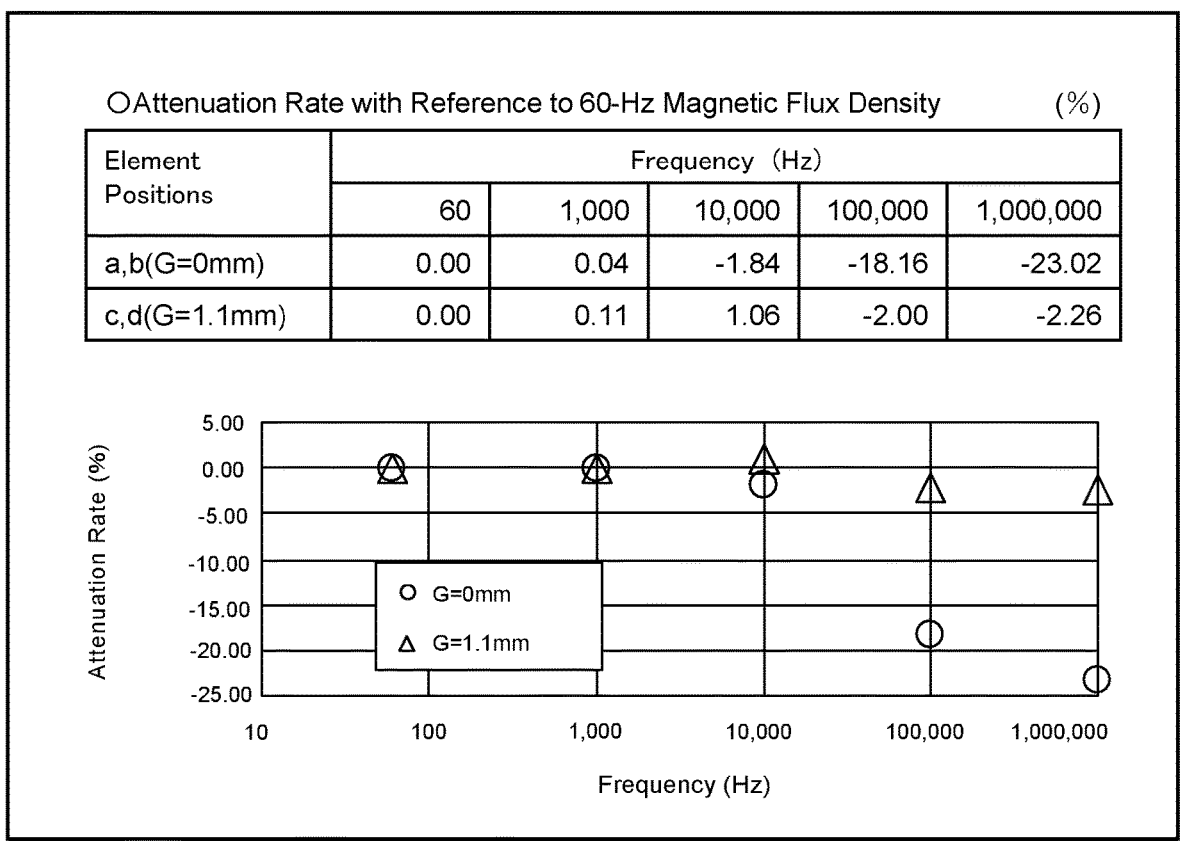
FIG. 9B is a table and graph indicating the frequency characteristics of the attenuation rate of the magnetic flux density detected by the magnetism detection elements in the arrangement example in FIG. 9A.

FIG. 9B is a table and graph illustrating frequency characteristics of the attenuation rate of the magnetic flux density detected by the magnetism detection elements 1, 2 in the arrangement example of FIG. 9A. Referring to FIG. 9B, you can see that the attenuation rate of the magnetic flux density detected in the high-frequency area of 10 kHz or higher is lower and the frequency characteristics which are close to flat can be maintained in the case where the pair of magnetism detection elements 1, 2 is arranged at the asymmetric positions c, d with the deviation of the deviation distance G=1.1 mm rather than the case of the symmetric positions a, b.

In any one of the cases of FIGS. 4A, 5A, 6A, 7A, 8A, and 9A as explained above, the frequency characteristics when detecting the magnetic flux density generated in response to the electric current flowing through the conductor 20 can be enhanced by arranging the pair of magnetism detection elements 1, 2 at the asymmetric positions c, d. Therefore, you can see that by adopting the above-described arrangement of the magnetism detection elements for the electric current detection device, it is possible to provide the coreless-type electric current detection device which suppresses the influences of the external magnetic field and obtains the good frequency characteristics even in the high-frequency area.

(Circuit Configuration)

Figure 10:
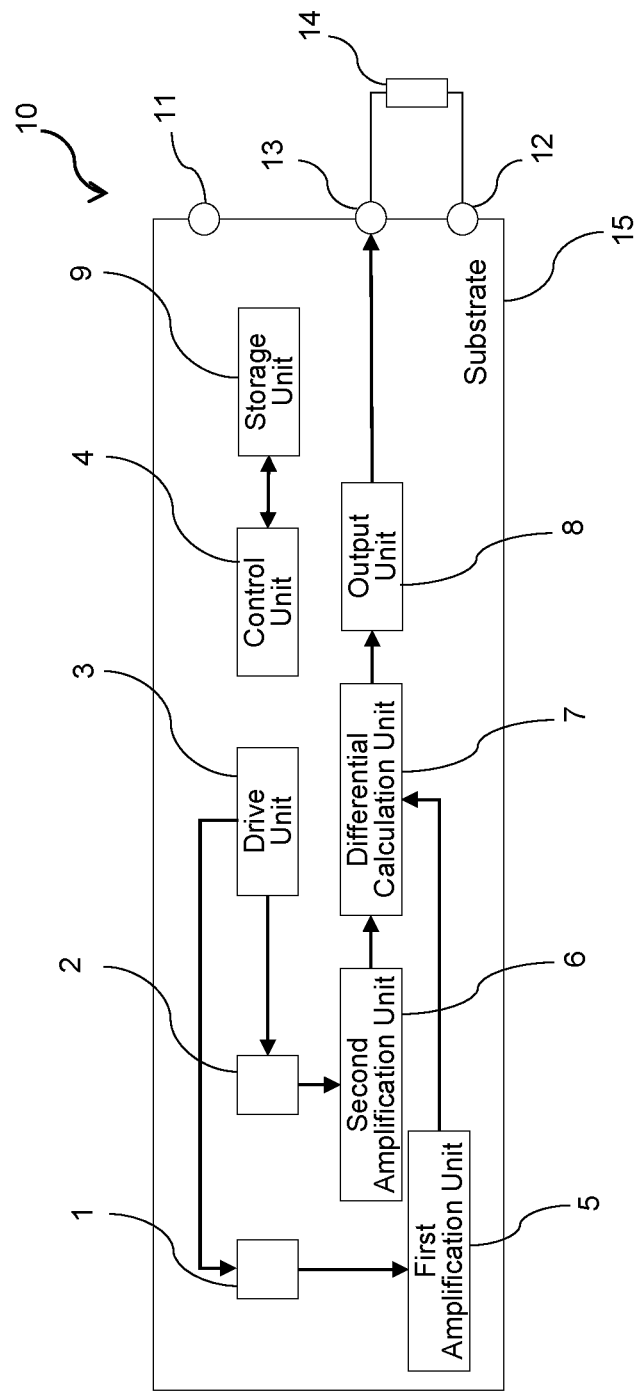
FIG. 10 is a block diagram illustrating a circuit configuration of an electric current detection device according to an embodiment of the present invention.

Next, a circuit configuration of the electric current detection device according to an embodiment of the present invention will be explained by using FIG. 10. FIG. 10 is a block diagram illustrating a circuit configuration of the electric current detection device according to the embodiment of the present invention. A circuit unit 10 illustrated in FIG. 10 constitutes the electric current detection device to which the aforementioned principles are applied, by being mounted at a specified position of the conductor 20 and used. This circuit unit 10 includes a pair of magnetism detection elements 1, 2, a drive unit 3, a control unit 4, a first amplification unit 5, a second amplification unit 6, a differential calculation unit 7, an output unit 8, and a storage unit 9.

The magnetism detection element 1 and the magnetism detection element 2 are located with orientations to have their sensitivity in mutually opposite directions at the asymmetric positions c, d relative to the conductor 20 in each of the aforementioned arrangement examples. These magnetism detection elements operate by using the voltage or electric current supplied from the drive unit 3 and detect the magnetic fluxes generated by the electric current to be detected flowing through the conductor 20. Then, the magnetism detection elements output detection signals according to the detection results of the magnetic fluxes to the first amplification unit 5 and the second amplification unit 6, respectively.

Incidentally, the magnetism detection elements 1, 2 are configured by using, for example, Hall elements, MR elements, GMR elements, or TMR elements. The MR elements are elements for detecting magnetic fluxes by using the Magneto Resistive Effect. The GMR elements are elements for detecting magnetic fluxes by using the Giant Magneto Resistive Effect. The TMR elements are elements for detecting magnetic fluxes by using the Tunnel Magneto Resistance Effect. Any arbitrary elements other than the above can be also used as the magnetism detection elements 1, 2 as long as they can detect the magnetic fluxes and output the detection signal(s) according to the detection results.

The first amplification unit 5 and the second amplification unit 6 amplify the detection signals, which are output respectively from the magnetism detection elements 1, 2, and output the amplified detection signals to the differential calculation unit 7. The differential calculation unit 7 performs differential calculation to find the difference between the measured values indicated by the respective detection signals on the basis of the detection signals, which have been output respectively from the first amplification unit 5 and the second amplification unit 6, and outputs the calculation result to the output unit 8. The output unit 8 outputs the electric current according to the difference value obtained by the differential calculation unit 7 to a load resistance 14 via an output terminal 13. For example, the output unit 8 amplifies an output signal from the differential calculation unit 7 into an electric current and outputs it to the load resistance 14. Accordingly, the voltage according to the value of the electric current to be measured flowing through the conductor 20 is generated between both the ends of the load resistance 14, thereby making it possible to obtain the measurement result of the electric current to be measured. Incidentally, the circuit unit 10 includes a positive supply terminal 11 and a negative supply terminal 12 for supplying a positive power source and a negative power source, respectively. One end of the load resistance 14 is coupled to the output terminal 13 and the other end is coupled to the negative supply terminal 12.

The control unit 4 is configured by using, for example, an integrated circuit or a microcomputer; and the drive unit 3 has a function that adjusts the voltage or electric current to be supplied to the magnetism detection elements 1, 2 and the respective amplification factors of the first amplification unit 5, the second amplification unit 6, and the differential calculation unit 7. The amplification factors and other set values which are used by the control unit 4 are stored in the storage unit 9.

A substrate 15 is configured by using, for example, a silicon substrate or a glass epoxy substrate and the respective components of the aforementioned circuit unit 10 are secured in a specified arrangement and the respective components are electrically connected to each other. After, for example, mold packaging using resin is applied to the circuit unit 10 equipped with the respective components on the substrate 15, the circuit unit 10 is attached to a specified position of the conductor 20. Consequently, the pair of magnetism detection elements 1, 2 can be arranged and secured at the aforementioned asymmetric positions on the conductor 20 via the substrate 15.

Incidentally, the drive unit 3 may supply voltages or electric currents of mutually reversed polarity to the magnetism detection element 1 and the magnetism detection element 2, respectively. In this case, the differential calculation unit 7 can perform differential calculation by adding together the detection signals which are output respectively from the first amplification unit 5 and the second amplification unit 6.

First Embodiment

Figure 11:
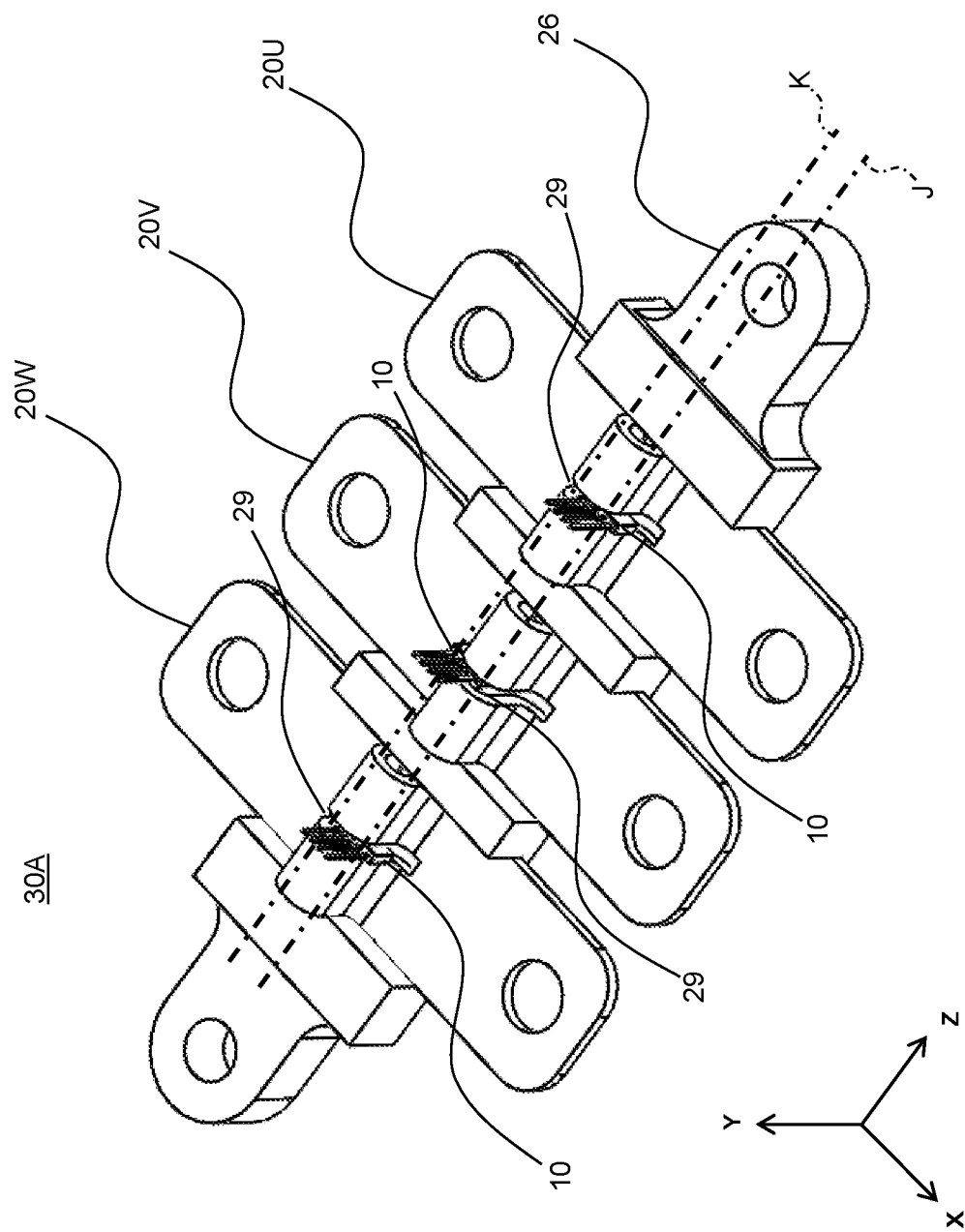
FIG. 11 is an external perspective view of an electric current detection device according to a first embodiment of the present invention.

Next, an explanation will be provided about the entire configuration of an electric current detection device according to a first embodiment of the present invention by using FIG. 11. FIG. 11 is an external perspective view of an electric current detection device 30A according to the first embodiment of the present invention. This electric current detection device 30A has, as a conductor 20 for three phases, bus bars 20U, 20V, 20W, each of which is provided with a slit 29 in a bent part formed by bending the relevant bus bar in a U shape in its plate thickness direction (Y-axis direction). The circuit unit 10 having the circuit configuration in FIG. 10 is placed in each slit 29 of the bus bar 20U, 20V, 20W. Consequently, the pair of magnetism detection elements 1, 2 is installed respectively close to the bent part of the bus bar 20U, 20V, 20W.

The bus bars 20U, 20V, 20W are respectively attached and secured to a case unit 26. A phase-U current flows through the bus bar 20U, a phase-V current flows through the bus bar 20V, and a phase-W current flows through the bus bar 20V, respectively. As the electric current detection device 30A includes three sets of a combination of the bus bar, which has the bent part formed therein by bending the long-plate-shaped conductor 20 having the slit 29 into the U shape, and the circuit unit 10 as described above, the electric current detection device 30A is designed to be capable of detecting the electric currents of three phases by using the magnetism detection elements 1, 2 provided in the respective phases.

With the electric current detection device 30A in FIG. 11, the circuit units 10 of the mutually adjacent phases are arranged respectively at different positions relative to the bus bars 20U, 20V, 20W. Regarding this point, an explanation will be provided below with reference to FIG. 12, FIG. 13A, FIG. 13B, and FIG. 13C.

Figure 12:
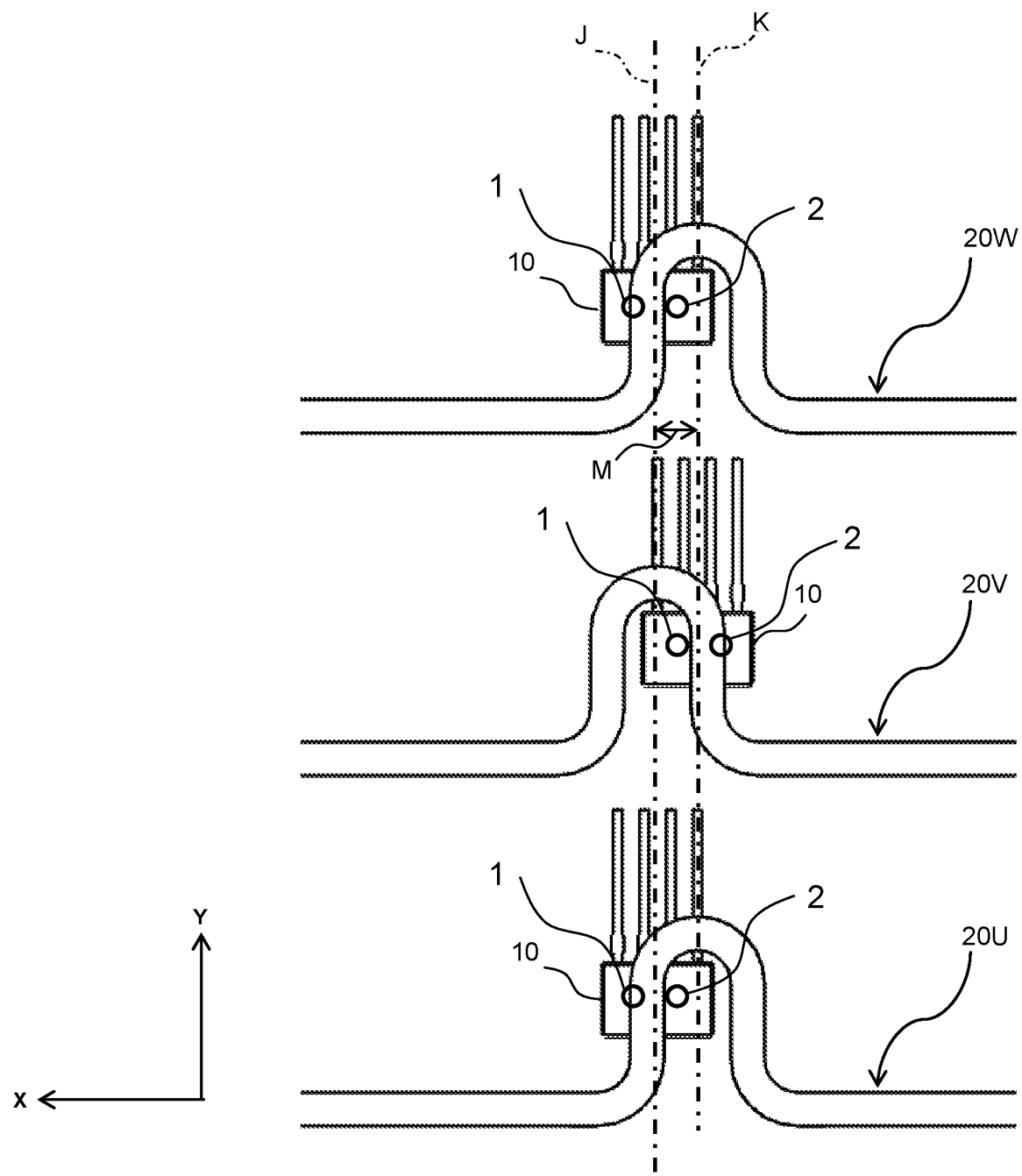
FIG. 12 is a diagram for explaining an arrangement of circuit units for the electric current detection device according to the first embodiment of the present invention.

FIG. 12 is a diagram for explaining the arrangement of the circuit units for the electric current detection device according to the first embodiment of the present invention. FIG. 12 shows front views of the bus bars 20U, 20V, 20W, which are illustrated in FIG. 11 and are rearranged by displacing them in the Y-axis direction, together with the circuit unit 10 as seen from the Z-axis direction in order to make it easier to see the arrangement of the circuit unit 10 in each phase.

In FIG. 12, a reference line J indicating a center position of the bent part of the bus bar 20V and a reference line K indicating a center position of the bent part of the bus bar 20U are mutually displaced from each other by the deviation distance M in the X-axis direction. Furthermore, the circuit unit 10 which is set and secured in the slit 29 of each bus bar 20U, 20V, 20W is mounted so that the pair of magnetism detection elements 1, 2 is located at the aforementioned asymmetric positions, that is, the positions corresponding to the positions c, d which are explained with reference to FIGS. 6A, 7A, and 8A, respectively.

In FIG. 12, the positional relationship between the center position of the circuit unit 10 attached to the bus bar 20V, that is, the center position of the magnetism detection elements 1, 2 corresponding to the phase V and the reference line K indicating the center position of the bent parts of the bus bars 20U, 20W of the phase U and the phase W arranged adjacent to the bus bar 20V is decided so that they match each other in the Z-axis direction which is the extending direction of the bus bars 20U, 20V, 20W. Similarly, the positional relationship between the center position of the circuit unit 10 attached to the bus bars 20U, 20W, that is, the center position of the magnetism detection elements 1, 2 corresponding to the phase U and the phase W and the reference line J indicating the center position of the bent part of the phase-V bus bar 20V located adjacent to the bus bars 20U, 20W is decided so that they match each other in the Z-axis direction which is the extending direction of the bus bars 20U, 20V, 20W. In other words, the deviation distance between the centers of the magnetism detection elements 1, 2 in the circuit units 10 of the phases adjacent to each other, that is, between the phase U and the phase V and between the phase V and the phase W is the same as the deviation distance M between the bent parts of the bus bars 20U, 20V, 20W. Consequently, the detected values by the magnetic flux density of the adjacent phases can be canceled with the differential calculation value of the detection signals obtained from the pair of magnetism detection elements 1, 2 of the respective phases. Therefore, it is possible to obtain the effect capable of diminishing the influences of the magnetic flux density of the adjacent phases.

Figure 13A:
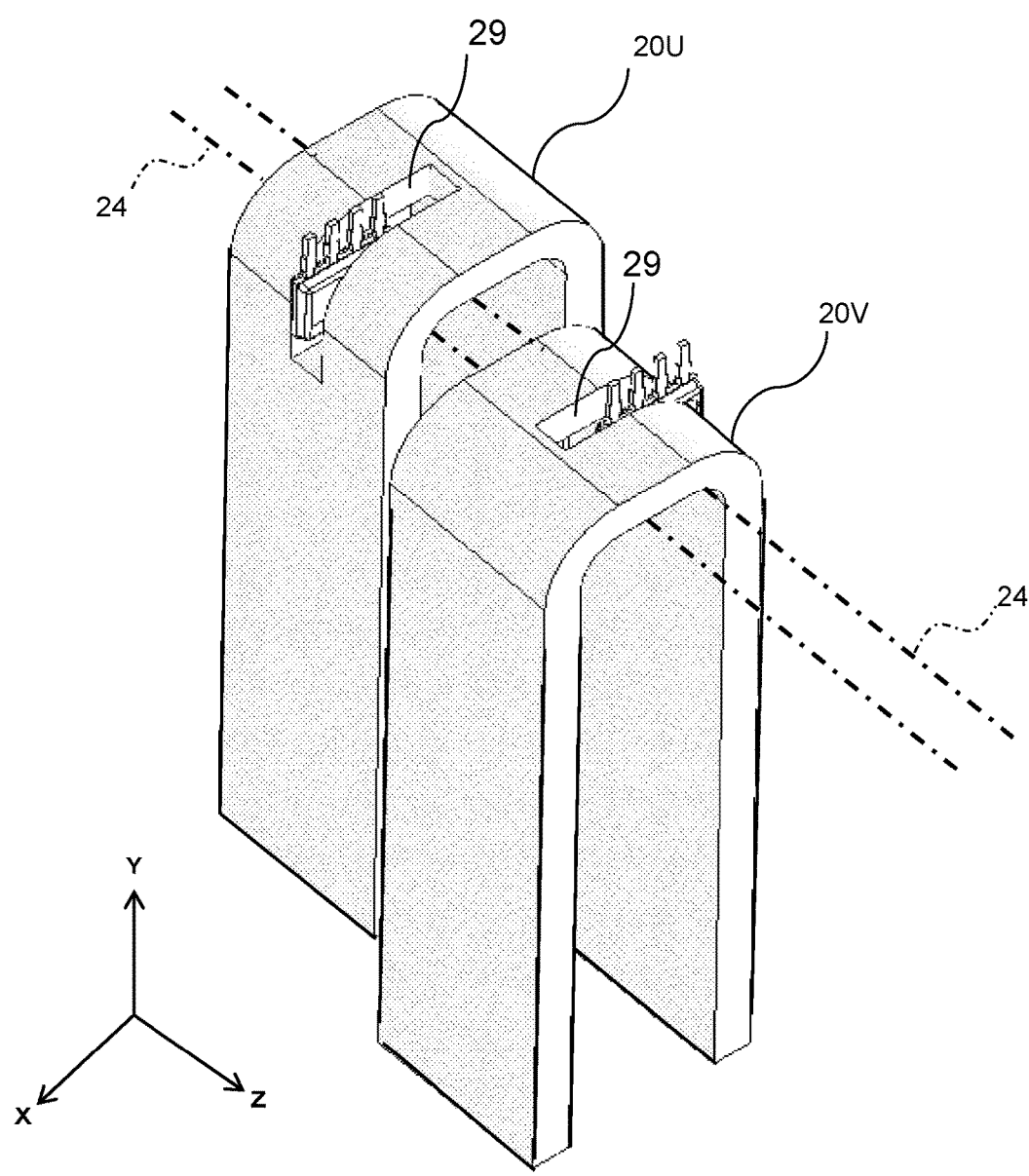
FIG. 13A is an enlarged perspective view of a phase-U bus bar and a phase-V bus bar for the electric current detection device according to the first embodiment of the present invention.

FIG. 13A is an enlarged perspective view of the phase-U bus bar 20U and the phase-V bus bar 20V for the electric current detection device according to the first embodiment of the present invention. FIG. 13A schematically shows an enlarged view by extracting only the bus bars 20U, 20V of the phase U and the phase V in order to explain that the electric current detection device 30A in FIG. 11 can diminish the influences of the magnetic flux density of the adjacent phases.

In FIG. 13A, each bending line indicated with the reference numeral 24 indicates a bending center of the side where the slit 29 is formed, among bent portions formed at both ends of the bent part of the bus bar 20U, 20V. It can be presumed from FIG. 13A that since the circuit units 10 are attached to the bus bars 20U, 20V at the positions which are mutually displaced in the X-axis direction, it is possible to diminish the influences of the adjacent phases on the differential calculation value obtained from the pair of magnetism detection elements 1, 2 possessed by these circuit units 10.

Figure 13B:
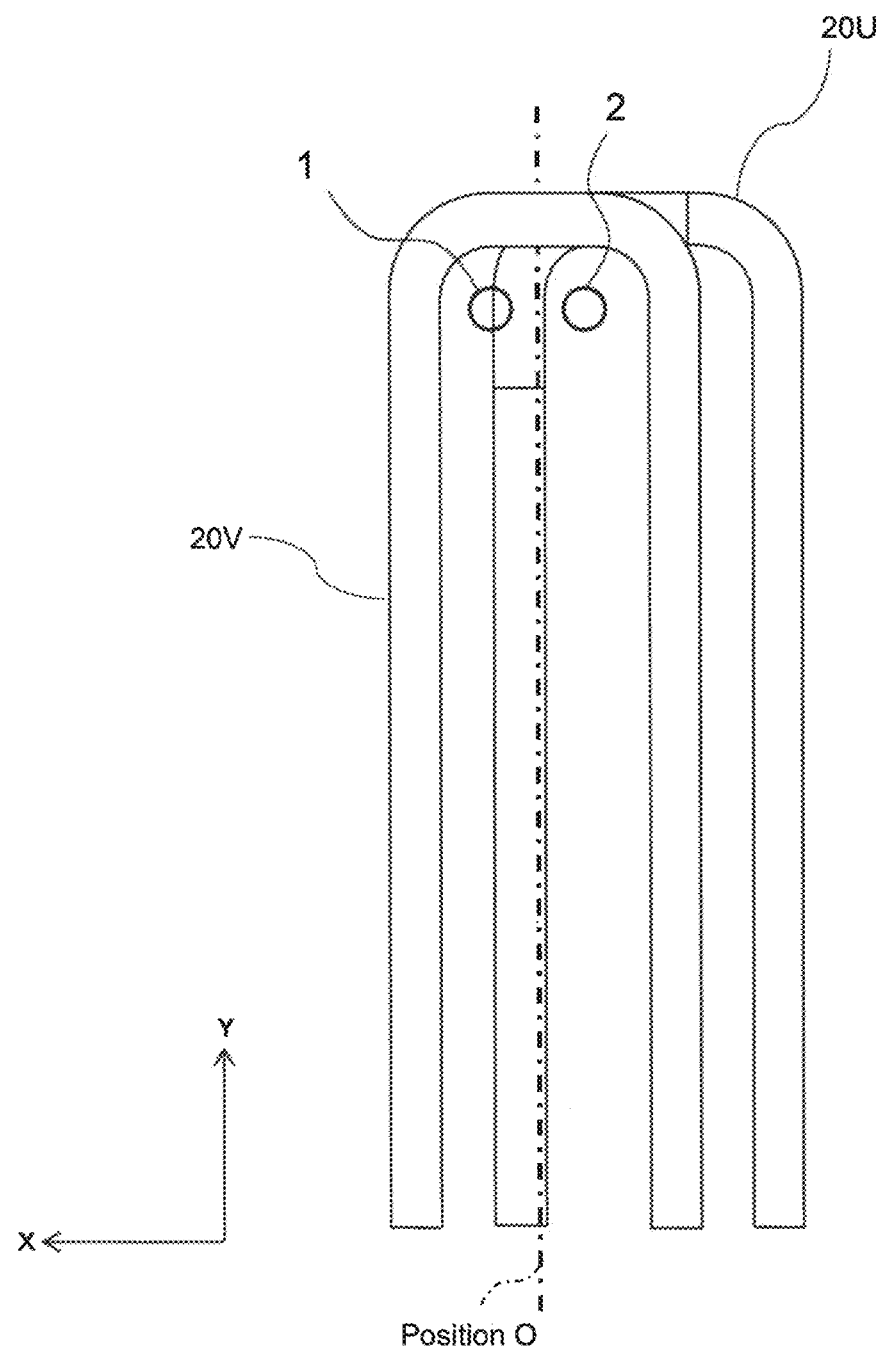
FIG. 13B is an enlarged front view of the magnetism detection elements and the bus bar of the phase U, and the phase-V bus bar in the electric current detection device according to the first embodiment of the present invention.

FIG. 13B is an enlarged front view of the magnetism detection elements 1, 2 and the bus bar 20U of the phase U and the bus bar 20V of the phase V for the electric current detection device according to the first embodiment of the present invention. FIG. 13B shows only the magnetism detection elements 1, 2 of the phase U in a perspective manner in order to explain the positional relationship between the bus bars 20U, 20V and the magnetism detection elements 1, 2 of the phase U as illustrated in FIG. 13A. In FIG. 13B, the position O indicated with an alternate long and short dash line represents the position with the equal distance from the magnetism detection elements 1, 2 of the phase U.

Figure 13C:
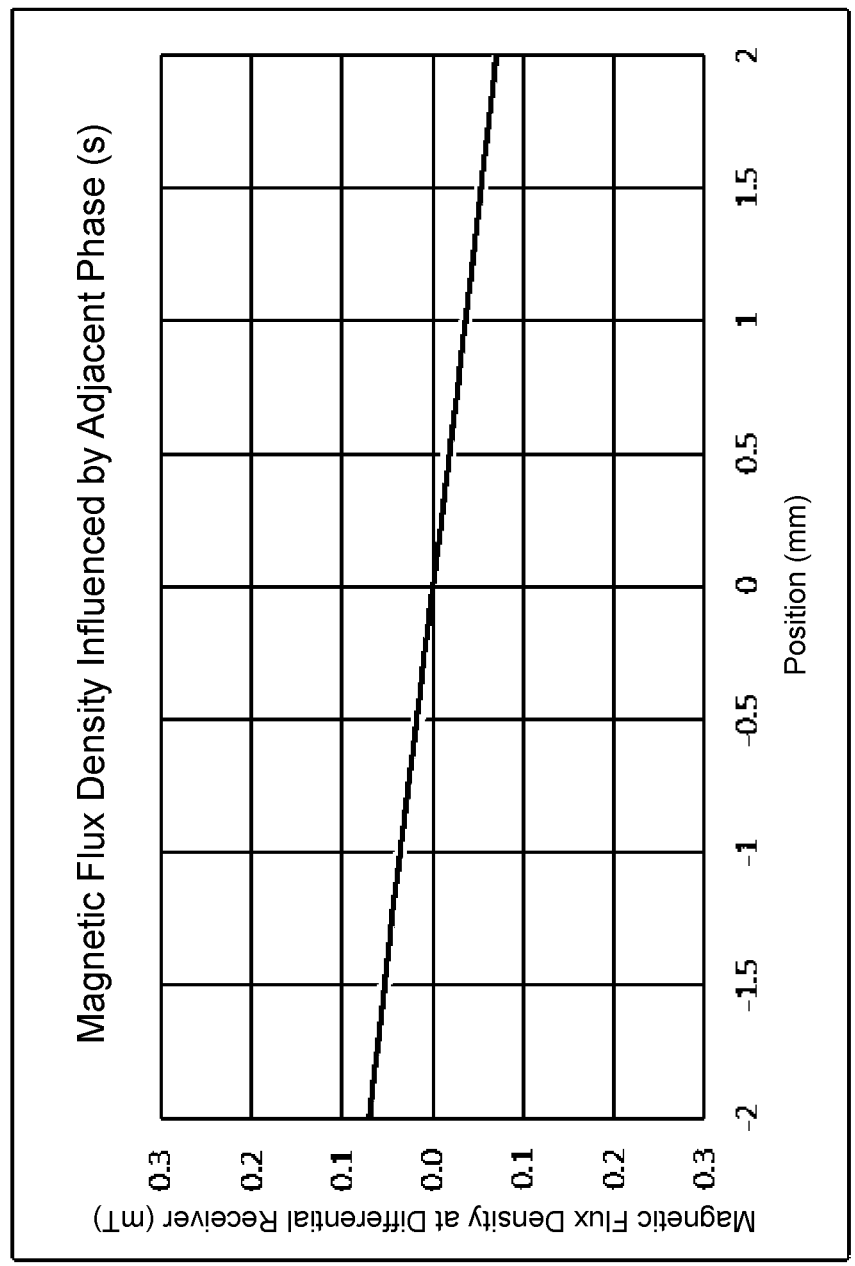
FIG. 13C is a graph of the magnetic flux density influenced by an adjacent phase(s)

FIG. 13C is a graph of the magnetic flux density influenced by the adjacent phase(s). The graph in FIG. 13C shows the relation between the center position of the bent part of the bus bar 20V relative to the magnetism detection elements 1, 2 of the phase U and the magnitude of the magnetic flux density regarding which the differential calculation value of the magnetism detection elements 1, 2 of the phase U is influenced by the adjacent phase(s). It can be seen from FIG. 13C that when the center position of the bent part of the bus bar 20V relative to the magnetism detection elements 1, 2 of the phase U is 0 mm, that is, when the position O in FIG. 13B and the bent center position of the bus bar 20V overlaps each other, the influences of the magnetic flux density of the phase V will be canceled and become 0 with regard to the differential calculation value of the magnetism detection elements 1, 2 of the phase U.

Consequently, the electric current detection device 30A can diminish the influences of the magnetic flux density of the adjacent phase(s). As a result, the operating accuracy of, for example, a three-phase inverter to which the electric current detection device 30A is applied is enhanced.

Second Embodiment

Figure 14A:
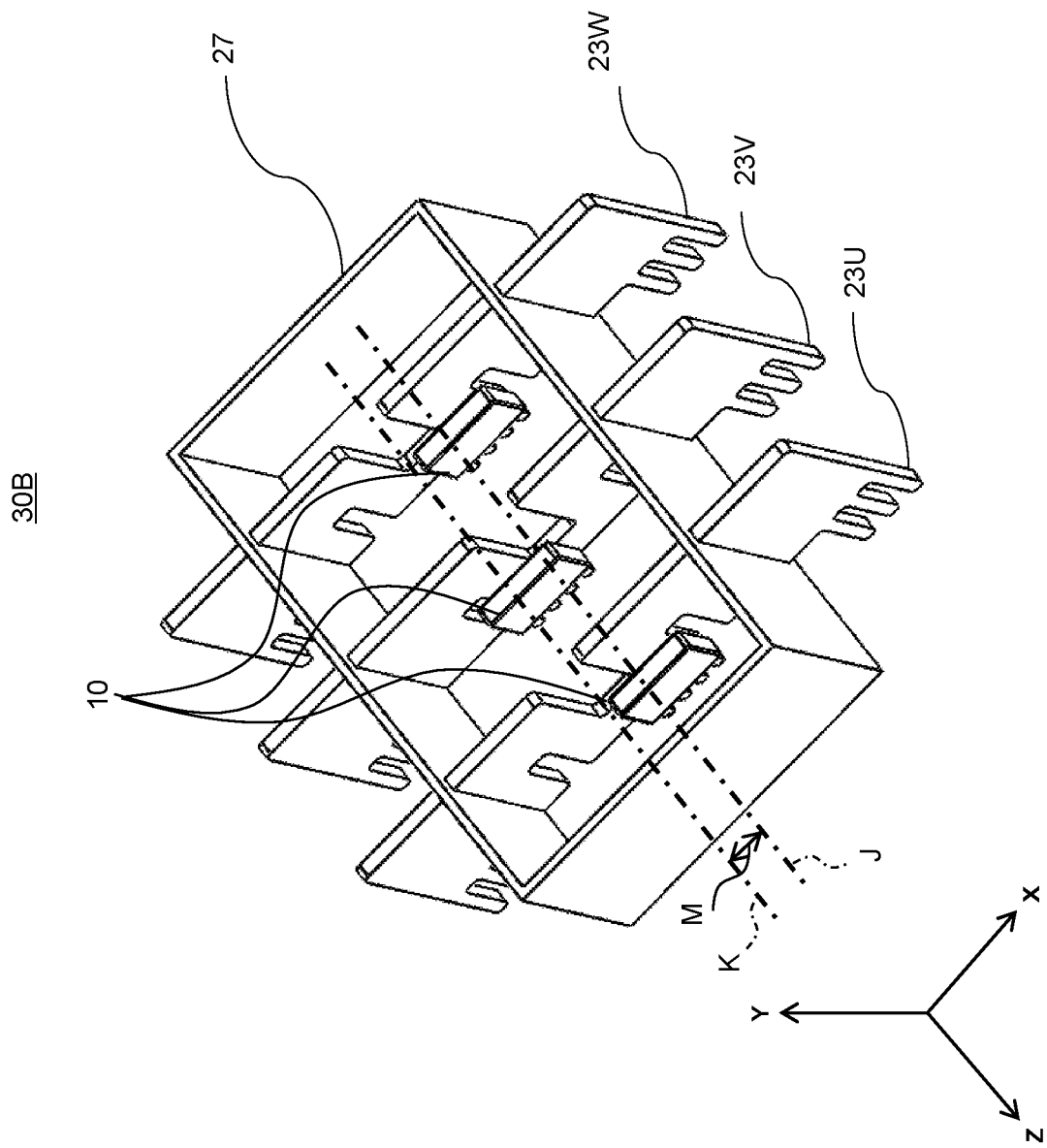
FIG. 14A is an external perspective view of an electric current detection device according to a second embodiment of the present invention.

Next, an explanation will be provided about the entire configuration of an electric current detection device according to a second embodiment of the present invention. FIG. 14A is an external perspective view of an electric current detection device 30B according to the second embodiment of the present invention. This electric current detection device 30B has, as a conductor 20 of three phases, bus bars 23U, 23V, 23W with each of which a U-shaped crank part is formed in the width direction (the Y-direction). The circuit unit 10 having the circuit configuration in FIG. 10 is placed at the crank part of each bus bar 23U, 23V, 23W. Consequently, the pair of magnetism detection elements 1, 2 are installed respectively close to the crank part of the bus bar 23U, 23V, 23W.

The circuit unit 10 of each phase together with the crank part of the bus bar 23U, 23V, 23W is placed in a case unit 27. The phase-U current flows through the bus bar 23U, the phase-V current flows through the bus bar 23V, and the phase-W current flows through the bus bar 23V, respectively. As the electric current detection device 30B includes three sets of a combination of the bus bar, which has the crank part formed in the long-plate-shaped conductor 20, and the circuit unit 10 as described above, the electric current detection device 30B is designed to be capable of detecting the electric currents of three phases by using the magnetism detection elements 1, 2 provided in the respective phases.

Figure 14B:
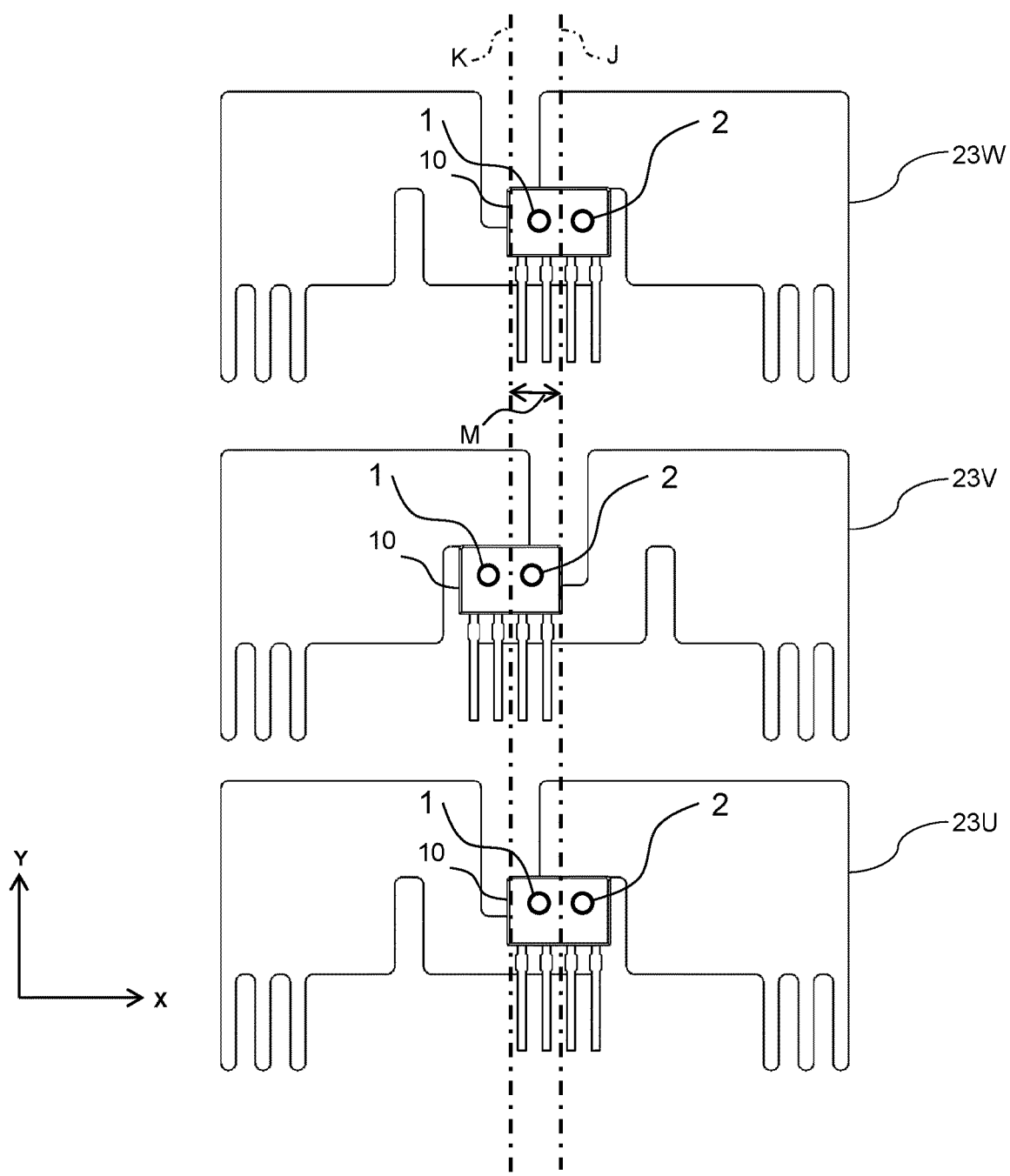
FIG. 14B is a diagram for explaining an arrangement of a circuit unit for the electric current detection device according to the second embodiment of the present invention.

FIG. 14B is a diagram for explaining the arrangement of the circuit units for the electric current detection device according to the second embodiment of the present invention. FIG. 14B shows front views of the bus bars 23U, 23V, 23W, which are illustrated in FIG. 14 and are rearranged by displacing them in the Y-axis direction, together with the circuit unit 10 as seen from the Z-axis direction in order to make it easier to see the arrangement of the circuit unit 10 in each phase.

In FIG. 14B in the same manner as in FIG. 12 explained with regard to the first embodiment, the reference line J indicating a center position of the crank part of the bus bar 23V and the reference line K indicating a center position of the crank part of the bus bar 23U, 23W are mutually displaced from each other by the deviation distance M in the X-axis direction. Furthermore, the circuit unit 10 which is located at each bus bar 23U, 23V, 23W is mounted so that the pair of magnetism detection elements 1, 2 is located at the aforementioned asymmetric positions, that is, the positions corresponding to the positions c, d, which are explained with reference to FIG. 9A, relative to the bus bar 23U, 23V, 23W.

In FIG. 14B, the positional relationship between the center position of the circuit unit 10 attached to the bus bar 23V, that is, the center position of the magnetism detection elements 1, 2 corresponding to the phase V and the reference line K indicating the center position of the crank part of the bus bar 23U, 23W of the phase U and the phase W arranged adjacent to the bus bar 23V is decided so that they match each other in the Z-axis direction which is the extending direction of the bus bars 23U, 23V, 23W. Similarly, the positional relationship between the center position of the circuit unit 10 attached to the bus bars 23U, 23W, that is, the center position of the magnetism detection elements 1, 2 corresponding to the phase U and the phase W and the reference line J indicating the center position of the crank part of the phase-V bus bar 23V located adjacent to the bus bars 23U, 23W is decided so that they match each other in the Z-axis direction which is the extending direction of the bus bars 23U, 23V, 23W. In other words, the deviation distance between the centers of the magnetism detection elements 1, 2 in the circuit units 10 of the mutually adjacent phases, that is, between the phase U and the phase V and between the phase V and the phase W is the same as the deviation distance M between the crank parts of the bus bars 23U, 23V, 23W. Consequently, the detected values by the magnetic flux density of the adjacent phases can be canceled with the differential calculation values of the detection signals obtained from the pair of magnetism detection elements 1, 2 of the respective phases. Therefore, it is possible to obtain the effect capable of diminishing the influences of the magnetic flux density of the adjacent phases.

Now, an explanation will be provided about the aforementioned advantageous effects of the first and second embodiments, that is, the best configuration to obtain the effect of diminishing the influences of the magnetic fluxes from the adjacent phases. For example, regarding the bus bars 20U, 20V, 20W having the U-shaped bent parts as explained in the first embodiment and the bus bars 23U, 23V, 23W having the U-shaped crank parts as explained in the second embodiment, the orientation of each bus bar changes by 180 degrees in the Y-axis direction from a starting point of the U-shape to its ending point. The above-described change in the orientation of the bus bar corresponds to a change in the orientation of phase current flowing through each bus bar. Specifically speaking, with each bus bar, the orientation of the phase current changes at the bent part or the crank part by 180 degrees in the Y-axis direction. Under the above-described precondition, it is preferable with the electric current detection devices 30A, 30B explained in the first and second embodiments that regarding the positions of the bent parts or the crank parts of the bus bars of the mutually adjacent phases, they should be arranged by displacing them from each other to make the difference in the orientation of the phase current become substantially 90 degrees. Consequently, it is possible to sufficiently obtain the effect of diminishing the influences of the magnetic fluxes from the adjacent phases.

The electric current detection devices according to the embodiments of the present invention 30A, 30B (hereinafter sometimes collectively referred to as the "electric current detection device 30") can be summarized as follows.

[1] The electric current detection device 30 includes: the conductor 20 (the bus bars 20U, 20V, 20W and the bus bars 23U, 23V, 23W) to which the electric current to be measured is applied; and the circuit unit 10 that has at least a pair of the magnetism detection elements 1, 2 for respectively detecting magnetic fluxes generated around the conductor 20 by the electric current to be measured and that detects the electric current to be measured on the basis of the detection signals obtained from the pair of magnetism detection elements 1, 2. The pair of magnetism detection elements 1, 2 is arranged at the asymmetric positions c, d avoiding the cross-section center E of the conductor 20 and having mutually different distances from the cross-section center E. Consequently, it is possible to provide the coreless-type electric current detection device which suppresses the influences of the external magnetic field and obtains the good frequency characteristics even in the high-frequency area.

[2] With the electric current detection device 30 as described in [1] above, the pair of magnetism detection elements 1, 2 is arranged at the asymmetric positions c, d by being displaced with the specified deviation distance G from the symmetric positions each having the equal distance from the cross-section center of the conductor 20E. This deviation distance G should preferably be decided to avoid the arrangement where the pair of magnetism detection elements 1, 2 respectively detects the magnetic fluxes in the same direction, and the arrangement where either one of the pair of magnetism detection elements 1, 2 does not detect the magnetic fluxes. Consequently, it is possible to suppress the influences of the external magnetic field and obtain the good frequency characteristics even in the high-frequency area.

[3] With the electric current detection device 30 as described in [1] above, the conductor 20 has a long plate shape that extends in a specified extending direction and whose cross section taken perpendicularly to the extending direction is longer in a width direction than a plate thickness direction. The pair of magnetism detection elements 1, 2 is arranged by aligning them in the width direction or the plate thickness direction of the conductor 20. Consequently, the pair of magnetism detection elements 1, 2 can be reliably arranged at the asymmetric positions relative to the long-plate-shaped conductor 20.

[4] With the electric current detection device 30 as described in [1] above, the circuit unit 10 has the substrate 15 for securing the pair of magnetism detection elements 1, 2. The pair of magnetism detection elements 1, 2 is arranged at the asymmetric positions c, d via the substrate 15. Consequently, the pair of magnetism detection elements 1, 2 can be positioned accurately relative to the conductor 20 and can be reliably arranged at the asymmetric positions.

[5] With the electric current detection device 30 as described in [1] above, the pair of magnetism detection elements 1, 2 is arranged close to the bent part or the crank part which is formed at the conductor 20. Furthermore, the electric current detection device 30 has a plurality of conductors 20 as the bus bars 20U, 20V, 20W or the bus bars 23U, 23V, 23W and the electric current to be measured of the different phase flows through each of the plurality of conductors 20. The pair of magnetism detection elements 1, 2 is arranged at the asymmetric positions relative to each of the plurality of the conductor 20. Furthermore, as explained with reference to FIGS. 12 and 14B respectively, the center position of the pair of magnetism detection elements 1, 2 correspond to an arbitrary phase, and the center position of the bent part or the crank part of the conductor 20 located adjacent to the conductor 20 corresponding to the above-described phase match each other in the extending direction of the conductor 20. Consequently, with the electric current detection device 30 capable of detecting the electric currents of a plurality of phases, it is possible to suppress the influences of the magnetic fluxes from the adjacent phases.

[6] With the electric current detection device 30 as described in [5] above, it is preferable that the plurality of the conductors 20 be arranged by displacing them from each other so that the difference in an orientation of the electric current to be measured at the bent part or the crank part between mutually adjacent phases becomes substantially 90 degrees. Consequently, it is possible to sufficiently obtain the effect of diminishing the influences of the magnetic fluxes from the adjacent phases.

[7] With the electric current detection device 30 as described in [1] above, it is preferable that the magnetism detection elements 1, 2 be Hall elements, MR elements, GMR elements, or TMR elements. Consequently, it is possible to easily and reliably implement the magnetism detection elements with desired detection performance.

Incidentally, regarding each embodiment explained above, an arbitrary number of magnetism detection elements may be further arranged in addition to the pair of magnetism detection elements 1, 2. In this case, the respective magnetism detection elements may be arranged at the symmetric positions a, b or the asymmetric positions c, d or may be arranged at other positions. The present invention can be applied to the electric current detection device having the arbitrary number of the magnetism detection elements in the arbitrary arrangement as long as it has at least a pair of magnetism detection elements 1, 2 and the arrangement of the magnetism detection elements 1, 2 satisfies the aforementioned characteristics.

Furthermore, in each embodiment explained above, the long-plate-shaped conductor 20 which extends in the specified extending direction has been explained as the conductor through which the electric current to be measured flows; however, conductors having other shapes may be also used. For example, it is possible to use, for example, conductors of a round bar shaped, a square bar shape, or a linear shape which extends in a specified extending direction. In this case as well, the electric current detection device to which the present invention is applied can be implemented as it has at least a pair of the magnetism detection elements 1, 2 and the arrangement of the magnetism detection elements 1, 2 satisfies the aforementioned characteristics.

The present invention is not limited to the above-described embodiments or variations and other forms which can be thought of within the scope of the technical idea of the present invention are also included within the scope of the present invention unless they impair the features of the present invention. Furthermore, the present invention may also have the configuration obtained by combining the plurality of the aforementioned embodiments.

REFERENCE SIGNS LIST

1, 2: magnetism detection elements
3: drive unit
4: control unit
5: first amplification unit
6: second amplification unit
7: differential calculation unit
8: output unit
9: storage unit
10: circuit unit
11: positive supply terminal
12: negative supply terminal
13: output terminal
14: load resistance
15: substrate
20: conductor
20U, 20V, 20W, 23U, 23V, 23W: bus bars
24: bending line
29: slit
30A, 30B: electric current detection device

The invention claimed is:

1. An electric current detection device comprising:
a plurality of conductors to each of which an electric current to be measured is applied; and
a circuit unit that has at least a pair of magnetism detection elements for respectively detecting magnetic fluxes generated around the conductor by the electric current to be measured and that detects the electric current to be measured on a basis of detection signals obtained from the pair of magnetism detection elements,
wherein a different phase of the electric current to be measured flows through each respective conductor of the plurality of conductors;
wherein the pair of magnetism detection elements is arranged at positions on the respective conductors which are close to a bent part or a crank part formed at the respective conductor, and which are asymmetric positions avoiding a cross-section center of the respective conductor and having mutually different distances from the cross-section center, for each respective conductor of the plurality of conductors; and
wherein a center position of the pair of magnetism detection elements of a respective conductor corresponding to an arbitrary phase, and a center position of the bent part or the crank part of a respective conductor located adjacent to the respective conductor corresponding to the arbitrary phase match each other in an extending direction of the plurality of conductors.

2. The electric current detection device according to claim 1,
wherein the pair of magnetism detection elements is arranged by being displaced with a specified deviation distance from symmetric positions each having an equal distance from the cross-section center.

3. The electric current detection device according to claim 2,
wherein the deviation distance is decided to avoid an arrangement where the pair of magnetism detection elements respectively detects the magnetic fluxes in the same direction and an arrangement where either one of the pair of magnetism detection elements does not detect the magnetic fluxes.

4. The electric current detection device according to claim 1,
wherein each respective conductor has a long plate shape that extends in a specified extending direction and whose cross section taken perpendicularly to the extending direction is longer in a width direction than a plate thickness direction; and wherein the pair of magnetism detection elements is arranged by aligning them in the width direction or the plate thickness direction of the respective conductor.

5. The electric current detection device according to claim 1, wherein the circuit unit has a substrate for securing the pair of magnetism detection elements; and wherein the pair of magnetism detection elements is arranged at the asymmetric positions via the substrate.

6. The electric current detection device according to claim 1, wherein the plurality of conductors are arranged by displacing the respective conductors from each other so that a difference in an orientation of the electric current to be measured at the bent part or the crank part between mutually adjacent phases becomes substantially 90 degrees.

7. The electric current detection device according to claim 1, wherein the magnetism detection elements are Hall elements, MR elements, GMR elements, or TMR elements.

8. The electric current detection device according to claim 1, wherein each respective conductor has a long plate shape that extends in a specified extending direction and whose cross section taken perpendicularly to the extending direction is longer in a width direction than a plate thickness direction;

wherein the pair of magnetism detection elements is arranged by aligning the pair of magnetism detection elements in the plate thickness direction of the respective conductor;

wherein the respective conductor has a slit passing through the respective conductor in the plate thickness direction at a center of the width direction in a specified range of the extending direction;

wherein at least a part of either one of the pair of magnetism detection elements is arranged in the slit; and wherein the other of the pair of magnetism detection elements is arranged at a position outside of the slit and overlapping with the one of the pair of magnetism detection elements when viewed from the plate thickness direction.

9. The electric current detection device according to claim 8, wherein the conductor has the bent part which is bent in the plate thickness direction; and wherein the slit is formed in a range including the bent part.

* * * * *